(12) United States Patent
Shibazaki

(10) Patent No.: US 10,120,288 B2
(45) Date of Patent: Nov. 6, 2018

(54) STAGE DEVICE, EXPOSURE APPARATUS, AND METHOD OF MANUFACTURING DEVICES

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 277 days.

(21) Appl. No.: 14/844,990

(22) Filed: Sep. 3, 2015

(65) Prior Publication Data

US 2016/0048084 A1 Feb. 18, 2016

Related U.S. Application Data

(60) Division of application No. 12/318,575, filed on Dec. 31, 2008, now Pat. No. 9,152,060, which is a division
(Continued)

(30) Foreign Application Priority Data

Feb. 17, 2003 (JP) ................. 2003-037929

(51) Int. Cl.
*G03F 7/20* (2006.01)
*H01L 21/68* (2006.01)

(52) U.S. Cl.
CPC ...... *G03F 7/70058* (2013.01); *G03F 7/70716* (2013.01); *G03F 7/70758* (2013.01); *G03F 7/70766* (2013.01); *H01L 21/68* (2013.01)

(58) Field of Classification Search
CPC ............ G03F 7/70758; G03F 7/70058; G03F 7/70716; G03F 7/70766; H01L 21/68
(Continued)

(56) References Cited

U.S. PATENT DOCUMENTS 5,874,820 A 2/1999 Lee
6,226,072 B1 5/2001 Yabu
(Continued)

FOREIGN PATENT DOCUMENTS

EP  1 134 793 A1  9/2001
JP  A-11-189332  7/1999
(Continued)

OTHER PUBLICATIONS

May 30, 2016 Search Report issued in European Patent Application No. 15196737.9.
(Continued)

*Primary Examiner* — Colin Kreutzer
(74) *Attorney, Agent, or Firm* — Oliff PLC

(57) ABSTRACT

An exposure apparatus performs scanning exposure of a substrate with an illumination light via a projection optical. A mask is supported on a first base member, with a slider provided inside a movable member. The first base member is arranged above the projection optical system and has a first opening through which the illumination light passes. The mask is supported in a second opening of the slider, through which the illumination light passes. The slider moves inside the movable member by a first drive system. A stage having a holder that holds the substrate is moved on a second base member by a second drive system. The first and the second drive systems move the mask and the substrate relative to the illumination light during scanning exposure. The movable member is moved by a reaction force generated by a movement of the slider by the first drive system.

18 Claims, 12 Drawing Sheets

Related U.S. Application Data of application No. 11/147,287, filed on Jun. 8, 2005, now Pat. No. 7,489,389, which is a continuation-in-part of application No. PCT/JP2004/000655, filed on Jan. 26, 2004.

(58) Field of Classification Search
USPC .................. 310/12.05, 12.06; 355/72, 75
See application file for complete search history.

(56) References Cited

U.S. PATENT DOCUMENTS

| | | | |
|---|---|---|---|
| 6,252,314 | B1 | 6/2001 | Ebinuma |
| 6,252,370 | B1 | 6/2001 | Ebihara et al. |
| 6,281,655 | B1 | 8/2001 | Poon et al. |
| 6,323,935 | B1 | 11/2001 | Ebihara et al. |
| 6,396,556 | B1 | 5/2002 | Ebinuma et al. |
| 6,549,268 | B1 | 4/2003 | Nishi |
| 7,489,389 | B2 | 2/2009 | Shibazaki |
| 9,152,060 | B2 | 10/2015 | Shibazaki |
| 2001/0006762 | A1 | 7/2001 | Kwan et al. |
| 2001/0045810 | A1 | 11/2001 | Poon et al. |
| 2002/0003616 | A1 | 1/2002 | Ebinuma et al. |
| 2002/0075467 | A1 | 6/2002 | Tanaka et al. |

FOREIGN PATENT DOCUMENTS

| | | |
|---|---|---|
| JP | A-2000-077503 | 3/2000 |
| JP | A-2001-228275 | 8/2001 |
| JP | A-2002-110523 | 4/2002 |
| JP | A-2002-175963 | 6/2002 |
| JP | A-2002-217082 | 8/2002 |
| JP | A-2003-309055 | 10/2003 |
| WO | WO 99/66542 | 12/1999 |

OTHER PUBLICATIONS

Jun. 14, 2016 Office Action issued in European Patent Application No. 15196737.9.
Nov. 20, 2006 Office Action in U.S. Appl. No. 11/147,287.
May 24, 2007 Office Action in U.S. Appl. No. 11/147,287.
Feb. 13, 2008 Office Action in U.S. Appl. No. 11/147,287.
Oct. 7, 2008 Notice of Allowance in U.S. Appl. No. 11/147,287.
Jul. 6, 2004 International Search Report in International Application No. PCT/JP2004/000655.
Mar. 10, 2009 Supplementary European Search Report in European Application No. 04705159.4.
Oct. 29, 2010 Communication Pursuant to Article 94(3) in European Application No. 04705159.4.
Dec. 17, 2010 Office Action in Korean Application No. 2005-7011599, with translation.
Oct. 4, 2011 Office Action issued in Korean Application No. 2005-7011599 (with English translation).
Apr. 10, 2012 Office Action issued in Korean Patent Application No. 2011-7031715 (with English translation).
Feb. 5, 2013 Office Action issued in Korean Application No. 2011-7031715 (with English translation).
Apr. 23, 2013 Search Report issued in European Patent Application No. 12191221.6.
Aug. 31, 2010 Office Action issued in Japanese Patent Application No. 2009-093518 (with translation).
Aug. 31, 2010 Office Action issued in Japanese Patent Application No. 2009-093517 (with translation).
Jun. 1, 2011 Office Action issued in U.S. Appl. No. 12/318,575.
Dec. 30, 2011 Office Action issued in U.S. Appl. No. 12/318,575.
Oct. 5, 2012 Office Action issued in U.S. Appl. No. 12/318,575.
Jul. 2, 2013 Office Action issued in U.S. Appl. No. 12/318,575.
Feb. 5, 2014 Notice of Allowance issued in U.S. Appl. No. 12/318,575.
Sep. 7, 2014 Office Action issued in U.S. Appl. No. 12/318,575.
Dec. 31, 2014 Office Action issued in U.S. Appl. No. 12/318,575.
Jul. 31, 2015 Notice of Allowance issued in U.S. Appl. No. 12/318,575.

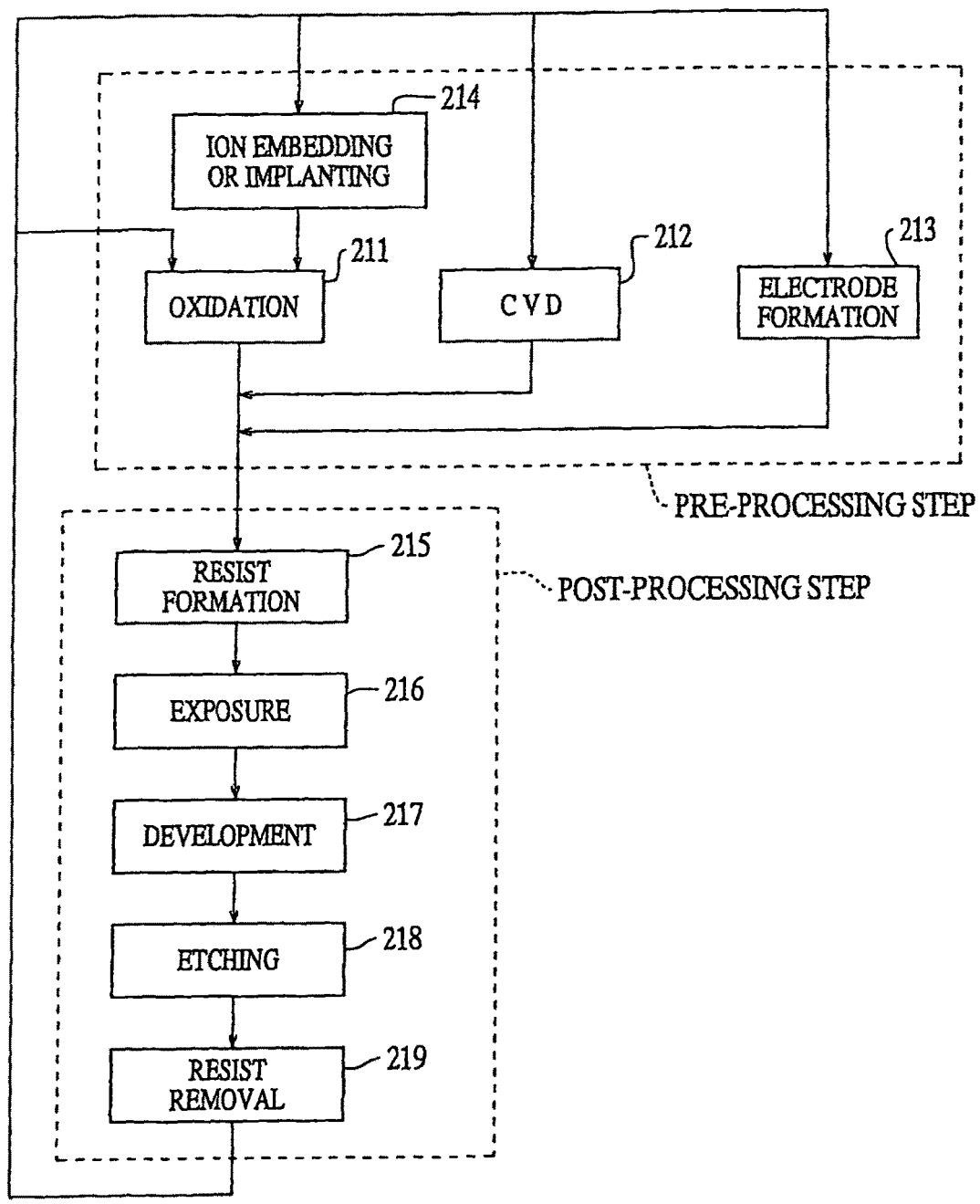

STAGE DEVICE, EXPOSURE APPARATUS, AND METHOD OF MANUFACTURING DEVICES

RELATED APPLICATIONS

This is a Divisional of U.S. patent application Ser. No. 12/318,575 filed Dec. 31, 2008 (now U.S. Pat. No. 9,152,060), which in turn is a Divisional of U.S. patent application Ser. No. 11/147,287 filed Jun. 8, 2005 (now U.S. Pat. No. 7,489,389), which in turn is a Continuation-In-Part of International Application No. PCT/JP04/000655 filed Jan. 26, 2004. The entire disclosure of said prior U.S. patent applications and of said International Application No. PCT/JP04/000655 is incorporated by reference herein in their entireties. The disclosure of the following priority application is incorporated herein by reference in its entirety: Japanese Patent Application No. 2003-037929 filed Feb. 17, 2003.

BACKGROUND

This invention relates to stage devices, exposure apparatus, and methods of manufacturing devices, and more specifically to stage devices provided with a supporting plate and a slider that moves along the supporting plate, exposure apparatus provided with such a stage device, and methods of manufacturing devices using the exposure apparatus.

Recently, in a lithographic process that manufactures a semiconductor element, a liquid crystal display element, etc., a step-and-scan type scanning exposure apparatus (so-called scanning stepper (scanner)) often is used that synchronously moves a mask or a reticle (hereafter referred to as "reticle") and a photosensitive object such as a wafer or a glass plate (hereafter referred to as "wafer") along a predetermined scanning direction (scan direction) and transfers a reticle pattern onto the wafer via a projection optical system. A scanning exposure apparatus can expose a large field with a projection optical system smaller than a stationary type exposure apparatus such as a stepper. Because of this, there are various advantages associated with a scanning exposure apparatus, e.g., manufacturing of a projection optical system is easier, high throughput is expected due to the reduction of the number of shots by large field exposure, averaging effects can be obtained by scanning a reticle and a substrate relative to a projection optical system, and distortion and depth of focus can be improved.

Therefore, in a scanning exposure apparatus, a drive device is needed that drives a reticle on the reticle side in addition to the wafer side. In recent scanning exposure apparatus, as a drive device on the reticle side, a reticle stage device with a coarse/micro-moving structure is used that has a reticle coarse-moving stage that is floatingly supported on a reticle supporting plate by an air bearing or the like and is driven in a scanning direction within a predetermined stroke range by a pair of linear motors arranged on both sides in a non-scanning direction perpendicular to a scanning direction, and a reticle micro-moving stage that is micro-moved in a scanning direction, a non-scanning direction, and a yawing direction by a voice coil motor or the like with respect to the reticle coarse-moving stage.

Furthermore, there also is a reticle stage device in which, in order to suppress the vibration and attitude fluctuation of a reticle support plate that are caused by a reaction force generated in a stator of a linear motor according to driving of a reticle stage, a countermass mechanism is arranged that has a countermass (weight member) that, upon receiving the reaction force, moves according to the law of conservation of momentum, e.g., in a direction opposite to the reticle stage along with a stator (linear guide) of a linear motor that extends in a scanning direction of the reticle stage.

However, in a reticle stage device used by a conventional scanning exposure apparatus, there are various points that need to be improved as follows:

a. There is a side guide between a supporting plate and a stator carrier that mounts the motor stator for driving the micro-moving stage. Therefore a reaction and a yawing moment at the time of positioning the reticle micro-moving stage (reticle) in a non-scanning direction, and a moment generated at the time of driving the coarse-moving stage, are transmitted to the supporting plate via the side guide, which causes vibration of the supporting plate. As a result, accurate position control (including positioning accuracy) of the reticle is deteriorated.

b. Wiring for supplying an electric current, piping for vacuum exhaust for a vacuum chuck, piping for supplying pressurized air for an air bearing, etc. were connected to the reticle-micro-moving stage and the reticle coarse-moving stage. Because of this, when the reticle micro-moving stage and the reticle coarse-moving stage were moved, the above-mentioned wiring and piping were dragged, and the tension of the wiring and the piping ultimately caused accurate position control (positioning accuracy) of the reticle to deteriorate.

c. Mechanical vibration near the reticle micro-moving stage and stage distortion due to heat caused positional measuring errors of the reticle micro-moving stage. As an example, as shown in FIG. 12A, a case is considered in which the position of a reticle micro-moving stage RST (reticle R) is measured by an interferometer having a length measurement axis LX via a moving mirror 169 arranged on the reticle micro-moving stage RST. In this case, if distortion shown in FIG. 12B is generated on the reticle stage RST, the $\Delta M$ measuring error (a type of Abbe number) is generated in positional information to be measured by the interferometer. In addition, in FIGS. 12A and 12B, symbol CR shows a neutral plane (curved neutral plane) of the reticle micro-moving stage RST.

d. Furthermore, the distortion of the reticle micro-moving stage caused the distortion (curving) of the moving mirror, and accurate position measurement of the reticle micro-moving stage, and in turn, accurate position control was deteriorated.

e. Furthermore, particularly in a reticle stage device provided with a countermass mechanism, it was difficult to maintain a sufficiently large mass ratio of a countermass (weight member) and a reticle stage. This is because in the above-mentioned conventional countermass mechanism, the countermass needs to have its center of gravity arranged on an axis of a linear guide. Thus, in order to increase the countermass weight, the countermass needs to be extended in an axial direction of the linear guide, or its dimension in a radial direction within an axially perpendicular plane about the linear guide needs to be uniformly increased, so there is naturally a restriction in terms of layout. Thus, it was difficult to sufficiently obtain a mass ratio of the countermass (weight member) and the reticle stage, so the stroke of the countermass became large, effects due to dragging the piping and local body distortion due to center of gravity movement could not be ignored, and therefore position controllability deteriorated.

f. In addition, the arrangement and the shape of the members near the reticle stage were complex, and the surrounding space was a complex open space. Thus, air adjusting efficiency was poor, accurate interferometer measurement, and in turn, the reticle position controllability, deteriorated due to air fluctuation (air temperature fluctuation), etc. Furthermore, when vacuum ultraviolet light such as an $F_2$ laser is used as exposure illumination light, a gas purge must be performed in the vicinity of the reticle (and at other locations) that replaces an atmospheric gas with an inert gas. However, the above-mentioned arrangement and shape of the members near the reticle stage were complex, so the design was extremely difficult.

SUMMARY

A first object is to provide a stage device that can improve position controllability of a moving body on which an object is placed.

A second object is to provide an exposure apparatus that can accomplish exposure with high accuracy.

A third object is to provide a method of manufacturing a device that can improve device productivity with high integration.

A first aspect relates to a stage device that includes a supporting plate, a slider, a frame-shaped member, and first and second drive mechanisms. The slider holds an object while floating above the supporting plate, and is movable along the supporting plate in three degrees-of-freedom directions within a two-dimensional plane including a first axis and a second axis perpendicular to the first axis. The frame-shaped member is movable in at least three degrees-of-freedom directions within the two-dimensional plane while floating above the supporting plate, and surrounds the slider. The first drive mechanism includes a first stator arranged on the frame-shaped member and a first movable element that in cooperation with the first stator generates a drive force that drives the slider in the first axis direction. The second drive mechanism includes a second stator arranged on the frame-shaped member and a second movable element that in cooperation with the second stator generates a drive force that drives the slider in the second axis direction.

A second aspect relates to a stage device that includes a supporting plate, a slider that holds an object while floating above the supporting plate and that is movable along the supporting plate, and a drive mechanism. The drive mechanism includes respective pairs of movable elements that are arranged symmetrically with respect to a neutral plane of the slider, on one side and another side in a second axis direction perpendicular to a first axis direction of an area where the object of the slider is mounted, and respective pairs of stators that in cooperation with the respective pairs of movable elements individually generate a drive force in the first axis direction.

A third aspect relates to a stage device that includes a supporting plate, a slider, a drive mechanism and an interferometer system. The slider holds an object while floating above the supporting plate and is movable along the supporting plate within a two-dimensional plane including a first axis and a second axis perpendicular to the first axis. The drive mechanism includes a linear motor that drives the slider in the first axis direction. The interferometer system irradiates a length measurement beam onto a reflective surface provided on the slider and measures positions in the first and second axis directions based on reflected light. The reflective surface onto which the length measurement beam in the second axis direction is irradiated from the interferometer system is arranged on part of the slider positioned outward from the linear motor.

A fourth aspect relates to a stage that includes a movable slider having a mounting surface on which an object is mounted, a pair of first movable elements arranged symmetrically with respect to the mounting surface of the slider, a pair of second movable elements different from the pair of first movable elements and arranged symmetrically with respect to the mounting surface of the slider, and a pair of stators that in cooperation with the pair of the first movable elements and the pair of the second movable elements drives the slider in a first axis direction.

A fifth aspect relates to a stage device that includes a slider that is movable while holding an object, a drive device, a countermass, and a position detector. The drive device includes a movable element connected to the slider and a stator that in cooperation with the movable element drives the slider along a first axis direction. The countermass includes a holding portion holding the stator and a weight portion, and is driven by a reaction force generated when the slider is driven. A reflective member is arranged on the slider so as to be positioned between the weight portion and the stator. The position detector irradiates a length measurement beam onto the reflective member and detects a position of the slider.

A sixth aspect relates to a stage device that includes a slider on which a reflective member is arranged and that is movable while holding an object, a drive device, a countermass, and a position detector. The drive device includes a movable element connected to the slider and a stator that in cooperation with the movable element drives the slider along a first axis direction. The countermass includes a transparent portion, holds the stator, and is driven by a reaction force that is generated when the slider is driven. The position detector irradiates a length measurement beam onto the reflective member via the transparent portion and detects a position of the slider.

BRIEF DESCRIPTION OF THE DRAWINGS

The invention will be described in conjunction with the following drawings of exemplary embodiments in which like reference numerals designate like elements, and in which:

FIG. 11 is a flowchart showing a specific example of step 204 of FIG. 10; and

DETAILED DESCRIPTION OF EXEMPLARY EMBODIMENTS

Figure 1:
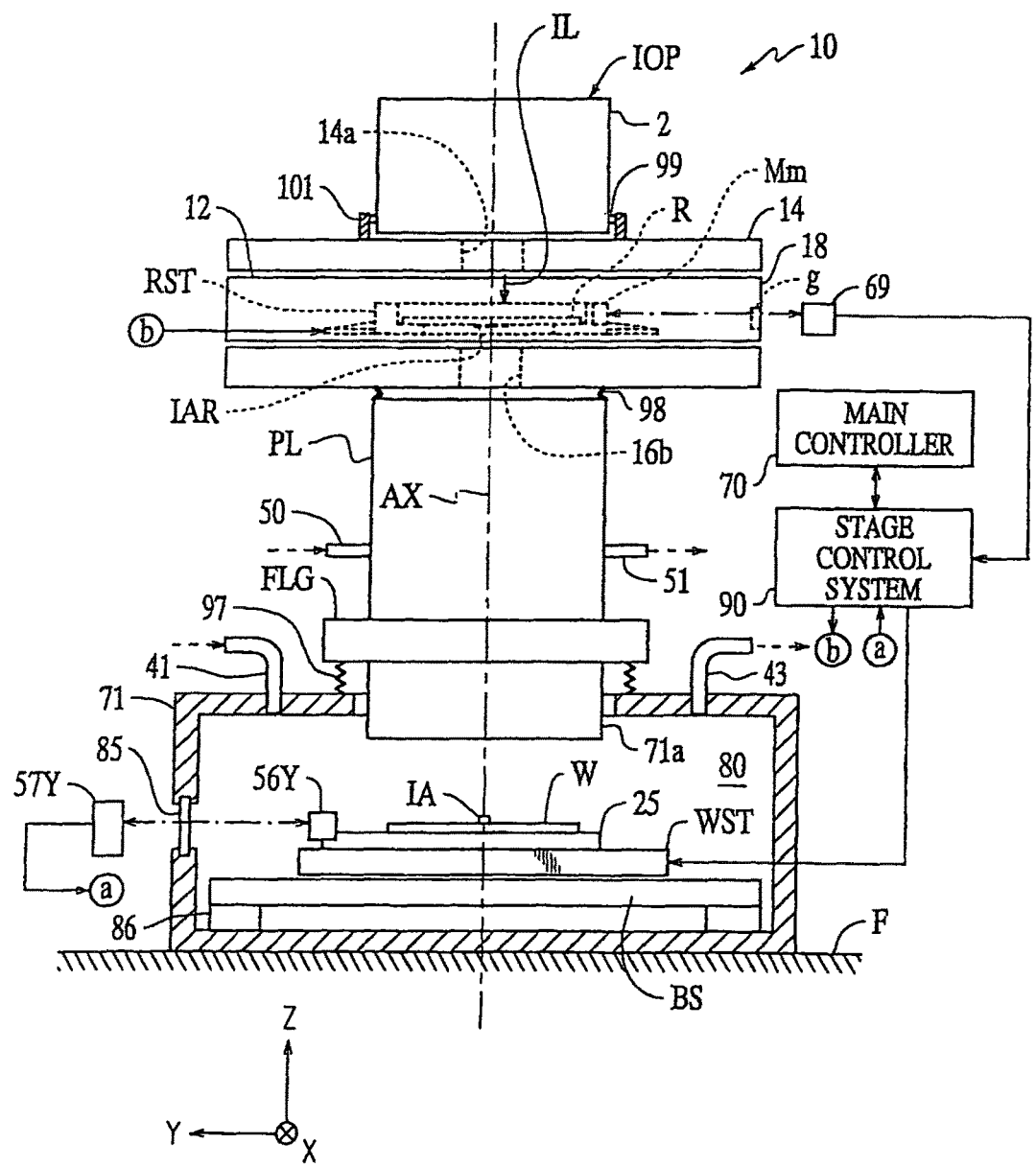
FIG. 1 is a diagram schematically showing a structure of an exposure apparatus according to an embodiment of this invention.

In a first aspect, this invention relates to a first stage device having a supporting plate, a slider, a frame-shaped member and first and second drive mechanisms. The slider holds an object while floating above the supporting plate, and can be moved along the supporting plate in three degrees-of-freedom directions within a two-dimensional plane including a first axis and a second axis perpendicular thereto. The frame-shaped member moves in at least three degrees-of-freedom directions within the two-dimensional plane while floating above the supporting plate and surrounds the slider. The first drive mechanism includes a first stator arranged on the frame-shaped member and a first movable element that in cooperation with the first stator generates a drive force that drives the slider in the first axis direction. The second drive mechanism includes a second stator arranged on the frame-shaped member and a second movable element that in cooperation with the second stator generates a drive force that drives the slider in the second axis direction.

Here, "cooperation" of the stator and movable element means that a drive force is generated due to some type of physical interaction (e.g., electromagnetic interaction, etc.) between the stator and the movable element. In this specification, "cooperation" is intended to have this meaning.

According to this aspect, the slider holds an object while floating above the supporting plate and can be moved along the supporting plate in three degrees-of-freedom directions within a two-dimensional plane including a first axis and a second axis perpendicular thereto, and a frame-shaped member moves in at least three degrees-of-freedom directions within the two-dimensional plane while floating above the supporting plate. First and second stators are arranged on the frame-shaped member. A first movable element that in cooperation with the first stator generates a drive force driving the slider in the first axis direction, and a second movable element that in cooperation with the second stator generates a drive force driving the slider in the second axis direction, are arranged on the slider. Therefore, when the slider is driven in the first or second axis direction by the first or second drive mechanism, a reaction force according to the drive force is generated by (acts on) the first or second stator. The frame-shaped member is moved by the reaction force in the three degrees-of-freedom directions within the two-dimensional plane substantially according to the law of conservation of momentum. That is, the frame-shaped member functions as a countermass. In this case, the reaction force is substantially completely canceled by the movement of the frame-shaped member. At the same time, the center of gravity movement of the system including the slider and the framed-shaped member is not generated, so an offset load cannot be caused to act on the supporting plate. Therefore, the positional controllability of the slider on which the object is mounted can be improved. Furthermore, in this case, the frame-shaped member is arranged so as to surround the slider. This arrangement causes the frame-shaped member's size to naturally become large, its mass to also become large, and therefore a large mass ratio between the frame-shaped member and the slider can be obtained. Thus, a moving stroke of the frame-shaped member can be relatively short. Furthermore, even when the frame-shaped member needs to be enlarged, there will be hardly any difficulty in doing this.

In this case, various structures of the first and second drive mechanisms can be considered. For example, the first drive mechanism can include at least two linear motors and the second drive mechanism can include at least one voice coil motor.

Figure 12A:
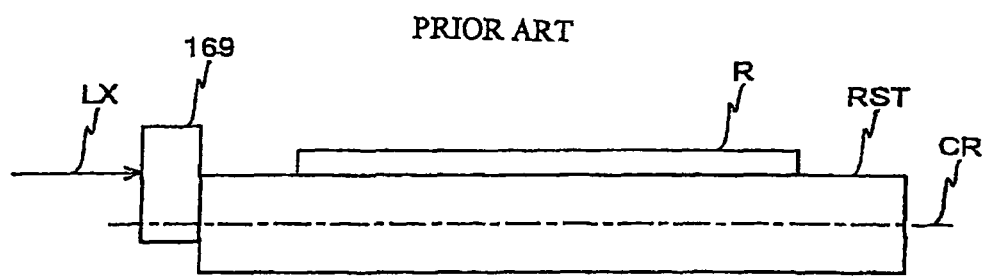
FIGS. 12A and 12B are diagrams explaining conventional technology.
Figure 12B:
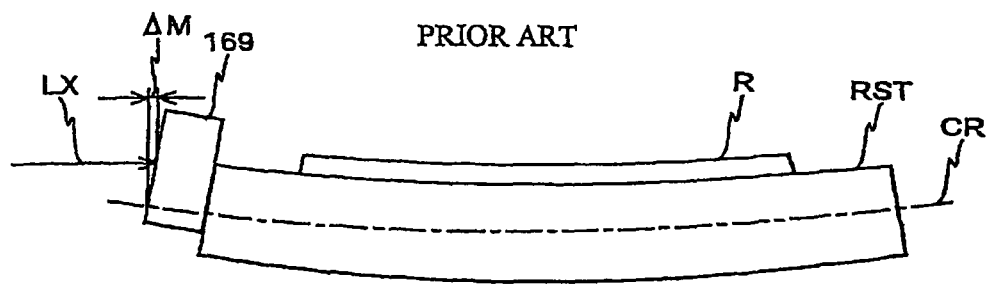

In the first stage device of this aspect of the invention, an interferometer system is further provided that measures the position of the slider. In the slider, a surface on which the object is mounted is formed in part of a neutral plane, and a position in a third axis direction, which is perpendicular to the two-dimensional plane, of an optical path of a length measurement beam from the interferometer system matches the position of the neutral plane. In this case, the position measurement error $\Delta M$ that is generated by a shift between the neutral plane and the length measurement axis when the slider is deformed, which was explained with reference to the above-mentioned FIG. 12B, can be made substantially zero.

In the first stage device of this aspect of the invention, extensions that are extended in the first axis direction are respectively arranged on end portions on one side and the other side of the slider in the first axis direction, and a gas hydrostatic pressure bearing is formed over the entire area in a longitudinal direction from the extension of the one side to the extension of the other side. A pressurized gas is supplied to the gas hydrostatic pressure bearing from the supporting plate without going through piping.

In a second aspect, this invention relates to a first exposure apparatus that synchronously moves a mask and a photosensitive object in a predetermined direction and transfers a pattern formed on the mask onto the photosensitive object. The exposure apparatus includes an illumination unit that illuminates the mask with illumination light, the first stage device of this invention on which the mask is mounted on the slider as the object, and a projection optical system that projects the illumination light emitted from the mask onto the photosensitive object.

By providing the first stage device of this invention, the accuracy of position control of the slider, and in turn, the accuracy of position control of the mask, can be improved. Thus, a pattern formed on the mask can be transferred onto a photosensitive object with high accuracy.

In this case, a space including an optical path of the illumination light between the illumination unit and the projection optical system is a space that can be purged by a specified gas in which a characteristic of absorbing the illumination light is smaller than that of air, and the frame-shaped member also can be used as a partition wall that separates the purged space from the outside. In this case, unlike a conventional apparatus, the space around the mask can easily be made a purged space.

In this case, on the surface of the side of the frame-shaped member that faces the supporting plate, which is on the opposite side with respect to the illumination unit, a first gas hydrostatic pressure bearing that uses the specified gas as a pressurized gas can be arranged over substantially the entire periphery. In addition, a second hydrostatic pressure bearing that uses the specified gas as a pressurized gas on the surface of the illumination unit side of the frame-shaped member can be arranged over substantially the entire periphery, and a plate can be further provided that is arranged opposite to substantially the entire surface of the illumination unit side of the frame-shaped member via a predetermined clearance, and to which a pressurized gas from the second gas hydrostatic pressure bearing is blown.

In the first exposure apparatus, when the frame-shaped member is used as a partition wall that isolates the purged space from the outside air, on the surface of the side of the frame-shaped member that faces the supporting plate, which is on the opposite side with respect to the illumination unit, a first gas hydrostatic pressure bearing that is a differential exhaust type and simultaneously performs vacuum suction and blowing of a pressurized gas can be arranged over substantially the entire periphery. In addition, on the surface of the illumination unit side of the frame-shaped member, a second hydrostatic pressure bearing that is a differential exhaust type and simultaneously performs vacuum suction and blowing of a pressurized gas is arranged over substantially the entire periphery, and a plate is further provided that is arranged opposite to substantially the entire surface of the illumination unit side of the frame-shaped member via a predetermined clearance, and to which a pressurized gas from the second gas hydrostatic pressure bearing is blown.

In the first exposure apparatus, when the frame-shaped member is used as a partition wall that isolates the purged space from the outside air, when an interferometer system is further provided that measures the position of the slider, an opening can be formed on a side surface of the frame-shaped member positioned on an optical path of a length measurement beam from the interferometer system to the slider within the purged space, and a cover glass can be arranged to seal the opening.

In a third aspect, this invention relates to a second stage device that includes a supporting plate, a slider that holds an object while floating above the supporting plate and that can be moved along the supporting plate, and a drive mechanism. The drive mechanism is provided with respective pairs of movable elements that are arranged symmetrically with respect to a neutral plane of the slider, on one side and the other side in a second axis direction perpendicular to a first axis direction of an area where the object of the slider is mounted, and respective pairs of stators that in cooperation with the respective pairs of movable elements individually generate a drive force in the first axis direction.

According to this aspect, the drive mechanism that drives the slider has the respective pairs of movable elements that are arranged, symmetrically with respect to the neutral plane, on one side and the other side in the second axis direction, of the area where the object of the slider is mounted, and pairs of stators that in cooperation with the respective movable elements individually respectively generate drive forces in the first axis direction. That is, on both sides in the second axis direction, a laminated structure is used that is formed of a movable element, a slider, and a movable element. Additionally, the movable elements are arranged symmetrically with respect to the neutral plane of the slider. In this case, the neutral plane of the slider substantially matches the height position of the center of gravity (position in the third axis direction perpendicular to the first and second axes), so the resultant force of the drive forces in the first axis direction generated by the cooperation of the respective pairs of movable elements and stators corresponding thereto acts on the position of the center of gravity of the slider. Therefore, the position controllability of the slider in at least the first axis direction can be improved, and the rotation of the slider about the second axis can be suppressed.

Furthermore, for example, when the movable elements are constituted by armature units, when the slider is driven in the first axis direction along the supporting plate, even if the slider is heated by heat generation of the movable elements by an electric current supplied to the respective movable elements, deformation of the slider due to the bimetal effect generated on the upper and lower sides of the neutral plane is canceled in the heated portion, and the deformation of the slider due to the bimetal effect ultimately is not generated.

Therefore, particularly when the position of the slider is measured by an interferometer via the reflective surface arranged on the slider, the position controllability can be improved.

In this case, the respective pairs of stators are arranged symmetrically with respect to the neutral plane of the slider.

In the second stage device of this invention, a gas hydrostatic pressure bearing in which extensions that extend in the first axis direction are arranged on the end portions of one side and the other side in the first axis direction of the slider, is formed over the entire area in a longitudinal direction from the extension of the one side to the extension of the other side, and a pressurized gas is supplied from the supporting plate to the gas hydrostatic pressure bearing without going through piping.

In a fourth aspect, this invention relates to a second exposure apparatus that synchronously moves a mask and a photosensitive object in a predetermined direction and transfers a pattern formed on the mask onto the photosensitive object. The exposure apparatus includes an illumination unit that illuminates the mask with illumination light, the second stage device on which the mask is mounted on the slider as the object, and a projection optical system that projects the illumination light emitted from the mask onto the photosensitive object.

According to this aspect, by providing the second stage device, the accurate position control of the slider, and in turn, synchronization accuracy of the mask and the photosensitive object, can be improved. Thus, a pattern formed on the mask can be transferred onto a photosensitive object with high accuracy.

In a fifth aspect, this invention relates to a third stage device that includes a supporting plate, a slider that holds an object while floating above the supporting plate and that can be moved along the supporting plate within a two-dimensional plane including a first axis and a second axis perpendicular thereto, a drive mechanism that includes a linear motor that drives the slider in the first axis direction, and an interferometer system. The interferometer system irradiates a length measurement beam onto a reflective surface provided on the slider and measures the positions in the first and second axis directions based on the reflected light. The reflective surface onto which the length measurement beam in the second axis direction from the interferometer system is irradiated is arranged on part of the slider positioned outward from the linear motor.

According to this aspect, the reflective surface to which the length measurement beam in the second axis direction from the interferometer system is irradiated is arranged outward from the linear motor that drives the slider in the first axis direction. Therefore, even if temperature fluctuation is generated in a gas surrounding the linear motor due to the heat generated by the linear motor, there is no effect on the length measurement beam in the second axis direction, so highly accurate measurement of the slider in the second axis direction can be performed by the interferometer. In this case, the length measurement beam in the first axis direction from the interferometer can be irradiated to other reflective surfaces (reflective surfaces positioned at a location where the heat generated by the linear motors is hardly affected) arranged on the slider without any particular problems. Therefore, the position of the slider in the first and second axis directions can be measured with good accuracy. That is, the positional controllability of the slider can be improved.

In this case, the reflective surface can be formed on an end surface of a bar-shaped second portion having a predetermined length different from that of a first portion on which the object of the slider is mounted. In addition, a reinforcement portion is arranged on a portion of the second portion excluding both end portions in the longitudinal direction, and both ends of the reinforcement portion are connected to the first portion via respective elastic hinge portions. In this case, on the first portion, in a position separated from one of the elastic hinge portions by a predetermined distance on a side opposite with respect to the first portion, another elastic hinge portion is further provided. In the third stage device of this invention, the first portion of the slider, the elastic hinge portion, and the second portion all can be integrally molded, one of them can be constituted by a member separate from the others, or all of them can be constituted by separate members.

In the third stage device of this invention, a gas hydrostatic pressure bearing, in which extensions that extend in the first axis direction are arranged on the end portions of one side and the other side in the first axis direction of the slider, is formed over the entire area in a longitudinal direction from the extension of the one side to the extension of the other side, and a pressurized gas is supplied from the supporting plate to the gas hydrostatic pressure bearing without going through piping.

In a sixth aspect, this invention relates to a third exposure apparatus that synchronously moves a mask and a photosensitive object in a predetermined direction and transfers a pattern formed on the mask onto the photosensitive object. The exposure apparatus includes an illumination unit that illuminates the mask with illumination light, the third stage device on which the mask is mounted on the slider as the object, and a projection optical system that projects the illumination light emitted from the mask onto the photosensitive object.

According to this aspect, by providing the third stage device of this invention the accurate position control of the slider, and in turn, synchronization accuracy of the mask and the photosensitive object can be improved. Thus, a pattern formed on the mask can be transferred onto a photosensitive object with high accuracy.

In a seventh aspect, this invention relates to a fourth stage device that includes a movable slider on which an object is mounted on a mounting surface, a pair of first movable elements arranged symmetrically with respect to the mounting surface of the slider, a pair of second movable elements different from the pair of first movable elements and arranged symmetrically with respect to the mounting surface of the slider, and a pair of stators that in cooperation with the pair of first movable elements and the pair of second movable elements drive the slider in a first axis direction. According to this aspect, in cooperation with the stators corresponding to the pair of first movable elements, and in cooperation with the stators corresponding to the pair of second movable elements, the resultant force of the drive forces in the first axis direction that are respectively generated can be caused to act on the vicinity of the center of gravity position of the slider. Therefore, the position controllability of the slider in at least the first axis direction can be improved, and the rotation of the slider about the second axis can be suppressed. In this case, the mounting surface matches a neutral plane of the slider.

In the fourth stage device of this invention, the pair of respective stators can be arranged symmetrically with respect to the mounting surface. In addition, a drive device can be further provided that has a first portion connected to the slider and a second portion that in cooperation with the first portion drives the slider along a second axis different from the first axis. In this case, a frame-shaped member can be further provided that holds the pair of stators and the second portion of the drive device. The frame-shaped member is driven by a reaction force that is generated when the slider is driven. The slider and the frame-shaped member can be arranged on the supporting plate.

In the fourth stage device of this invention, a position detector can be further provided, and the slider can be provided with a reflective surface. The position detector irradiates a length measurement beam onto the reflective surface and detects a position of the slider in the second axis direction. In this case, the pair of respective stators is arranged in a position that does not surround the length measurement beam.

In an eighth aspect, this invention relates to a fourth exposure apparatus that synchronously moves a mask and a photosensitive object in a predetermined direction and transfers a pattern formed on the mask onto the photosensitive object. The exposure apparatus includes an illumination unit that illuminates the mask with illumination light, the fourth stage device on which the mask is mounted on the slider as the object, and a projection optical system that projects the illumination light emitted from the mask onto the photosensitive object.

According to this aspect, by providing the fourth stage device of this invention, the accurate position control of the slider, and in turn, the accurate position control of the mask can be improved. Thus, a pattern formed on the mask can be transferred onto a photosensitive object with high accuracy.

In a ninth aspect, this invention relates to a fifth stage device that includes a slider that can be moved while holding an object, a drive device that is provided with a movable element connected to the slider and a stator that in cooperation with the movable element drives the slider along a first axis direction. In addition, a countermass that includes a holding portion holding the stator and a weight portion, is driven by a reaction force generated when the slider is driven. A reflective member is arranged on the slider so as to be positioned between the weight portion and the stator. A position detector irradiates a length measurement beam onto the reflective member and detects the position of the slider.

According to this aspect, when the slider is driven by the drive device along the first axis direction, due to the reaction force generated at the time of this driving, the countermass is moved substantially according to the law of conservation of momentum. The reaction force is substantially completely canceled by the movement of this countermass. At the same time, the center of gravity of the system including the slider and the countermass does not move, so an offset load cannot be caused to act on the support member that supports the slider and the countermass. Furthermore, the position of the slider is measured as the length measurement beam is irradiated from the position detector to the reflective member arranged on the slider so as to be positioned between the weight portion and the stators. That is, the reflective member to which the length measurement beam from the position detector is irradiated is arranged outward from the stators of the drive device that drives the slider in the first axis direction. Therefore, even if temperature fluctuation is generated in a gas surrounding the drive device due to the heat generated by the drive device, there is no effect on the length measurement beam, so the accurate position detection of the slider can be performed. Therefore, the position controllability of the slider on which the object is mounted can be improved.

The slider can be provided with a mounting portion that mounts the object on a neutral plane of the slider.

In the fifth stage device of this invention, the slider and the countermass can be arranged on the supporting plate.

In a tenth aspect, this invention relates to a fifth exposure apparatus that synchronously moves a mask and a photosensitive object in a predetermined direction and transfers a pattern formed on the mask onto the photosensitive object. The exposure apparatus includes an illumination unit that illuminates the mask with illumination light, the fifth stage device on which the mask is mounted on the slider as the object, and a projection optical system that projects the illumination light emitted from the mask onto the photosensitive object.

According to this aspect, by providing the fifth stage device of this invention, the accurate position control of the slider, and in turn, the accurate position control of the mask can be improved. Thus, a pattern formed on the mask can be transferred onto a photosensitive object with high accuracy.

In an eleventh aspect, this invention relates to a sixth stage device having a slider on which a reflective member is arranged and that can be moved while holding an object, a drive device that is provided with a movable element connected to the slider and a stator that in cooperation with the movable element drives the slider along a first axis direction, a countermass that is provided with a transparent portion and that holds the stator, and that is driven by a reaction force that is generated when the slider is driven, and a position detector that irradiates a length measurement beam onto the reflective member through the transparent portion and detects a position of the slider.

According to this aspect, when the slider is driven by the drive device along the first axis direction, due to the reaction force generated at the time of this driving, the countermass is moved substantially according to the law of conservation of momentum. The reaction force is substantially completely canceled by the movement of the countermass. At the same time, the center of gravity of the system including the slider and the countermass does not move, so an offset load cannot be caused to act on the support member that supports the slider and the countermass. Furthermore, by the position detector, the position of the slider is detected by irradiating the length measurement beam onto the reflective member via the transparent portion of the countermass, so even if the position detector is arranged outside of the countermass, the position of the slider can be accurately detected without any problems. Additionally, occurrence of the problems that are likely to occur when the position detector is arranged inside of the countermass (e.g., an out gas generated by an optical member, a detector, etc. that constitutes the position detector negatively affects the atmosphere within the countermass) can be suppressed.

The slider can be provided with a mounting portion on which the object is mounted at a neutral plane of the slider.

In the sixth stage device of this invention, the slider and the countermass can be arranged on the supporting plate.

In a twelfth aspect, this invention relates to a sixth exposure apparatus that synchronously moves a mask and a photosensitive object in a predetermined direction and transfers a pattern formed on the mask onto the photosensitive object. The exposure apparatus includes an illumination unit that illuminates the mask with illumination light, the sixth stage device on which the mask is mounted on the slider as the object, and a projection optical system that projects the illumination light emitted from the mask onto the photosensitive object.

According to this aspect, by providing the sixth stage device of this invention, the accurate position control of the slider, and in turn, the accurate position control of the mask can be improved. Thus, a pattern formed on the mask can be transferred onto a photosensitive object with high accuracy.

In addition, in a lithographic process, as exposure operation is performed by using any of the first to sixth exposure apparatus of this invention, and a pattern formed on the mask can be accurately transferred onto the photosensitive object. By doing this, micro-devices with high levels of integration can be accurately manufactured with good yield. Therefore, another aspect of this invention is a device manufacturing method using any of the first to sixth exposure apparatus of this invention.

The following explains exemplary embodiments of this invention with reference to FIGS. 1-9.

FIG. 1 shows a schematic structure of an exposure device 10 according to an embodiment. This exposure apparatus 10 is a step-and-scan type scanning exposure apparatus, i.e., a so-called scanning stepper (also called "scanner"). In this embodiment as described later, a projection optical system PL is arranged. Hereafter, an explanation is given in which an optical axis AX direction of the projection optical system that constitutes the projection optical system PL is a Z axis direction (third axis direction), a direction in which a reticle R as a mask (and an object) and a wafer W as a photosensitive object are relatively scanned (right and left directions of the paper plane of FIG. 1), within a plane perpendicular to the Z axis direction, is a Y axis direction (first axis direction), and a direction perpendicular to the Z axis and the Y axis (a direction perpendicular to the paper plane of FIG. 1) is an X axis direction (second axis direction).

This exposure apparatus 10 drives an illumination unit IOP and the reticle R in the Y axis direction with a predetermined stroke, and is provided with a reticle stage device 12 as a stage device that is micro-driven in the X axis direction, the Y axis direction, and the θz direction (rotation direction about the Z axis), the projection optical system PL, a wafer stage WST that drives the wafer W in the XY two-dimensional direction within the XY plane, and control systems, etc.

The illumination unit IOP includes a light source and an illumination optical system, irradiates illumination light IL as an energy beam to a rectangular or arc-shaped illumination area IAR regulated by a field stop (also called "masking blade" or "reticle blind") arranged therein, and illuminates the reticle R on which a circuit pattern is formed with uniform irradiation. An illumination unit that is the same as the illumination unit IOP is disclosed in, e.g., Japanese Laid-Open Patent Application 6-349701 and U.S. Pat. No. 5,534,970 corresponding thereto. Here, vacuum ultraviolet light such as ArF excimer laser (wavelength 193 nm) light or $F_2$ laser (wavelength 157 nm) light is used for the illumination light IL. Furthermore, far ultraviolet light, such as KrF excimer laser (wavelength 248 nm) light and a bright line (g line, i line, etc.) of the ultraviolet region from an ultra high-pressure mercury lamp, also can be used as the illumination light IL. The disclosure of the above-mentioned U.S. Pat. No. 5,534,970 is incorporated herein by reference in its entirety.

Meanwhile, when the light having the wavelength of the vacuum ultraviolet region is used as exposure light, it is desirable to remove from the optical path a gas (hereafter referred to as "absorption gas"), such as oxygen, moisture, a hydrocarbon gas, etc., having a strong absorption characteristic with respect to the light of that wavelength range. Because of this, in this embodiment, a specified gas having a characteristic in which absorption with respect to the light of the vacuum ultraviolet region is less than air (oxygen), a noble gas, e.g., nitrogen, helium, argon, neon, krypton, etc., or a mixed gas thereof (hereafter referred to as "low absorption gas") is filled in the space along the optical path of the illumination light IL inside the illumination unit IOP. As a result, the density of the absorption gas in the space along the optical path within the illumination unit IOP is several ppm or less.

In FIG. 1, the reticle stage device 12 is arranged under an illumination system side plate (cap plate) 14, which is a plate having an annular mounting portion 101 connected to the outer periphery of the lower end portion of the illumination unit IOP via a seal member 99 such as an O ring. The illumination system side plate 14 is substantially horizontally supported by an undepicted support member. In the substantial center, a rectangular-shaped opening 14A is formed that becomes an optical path (passage) for the illumination light IL.

Figure 2:
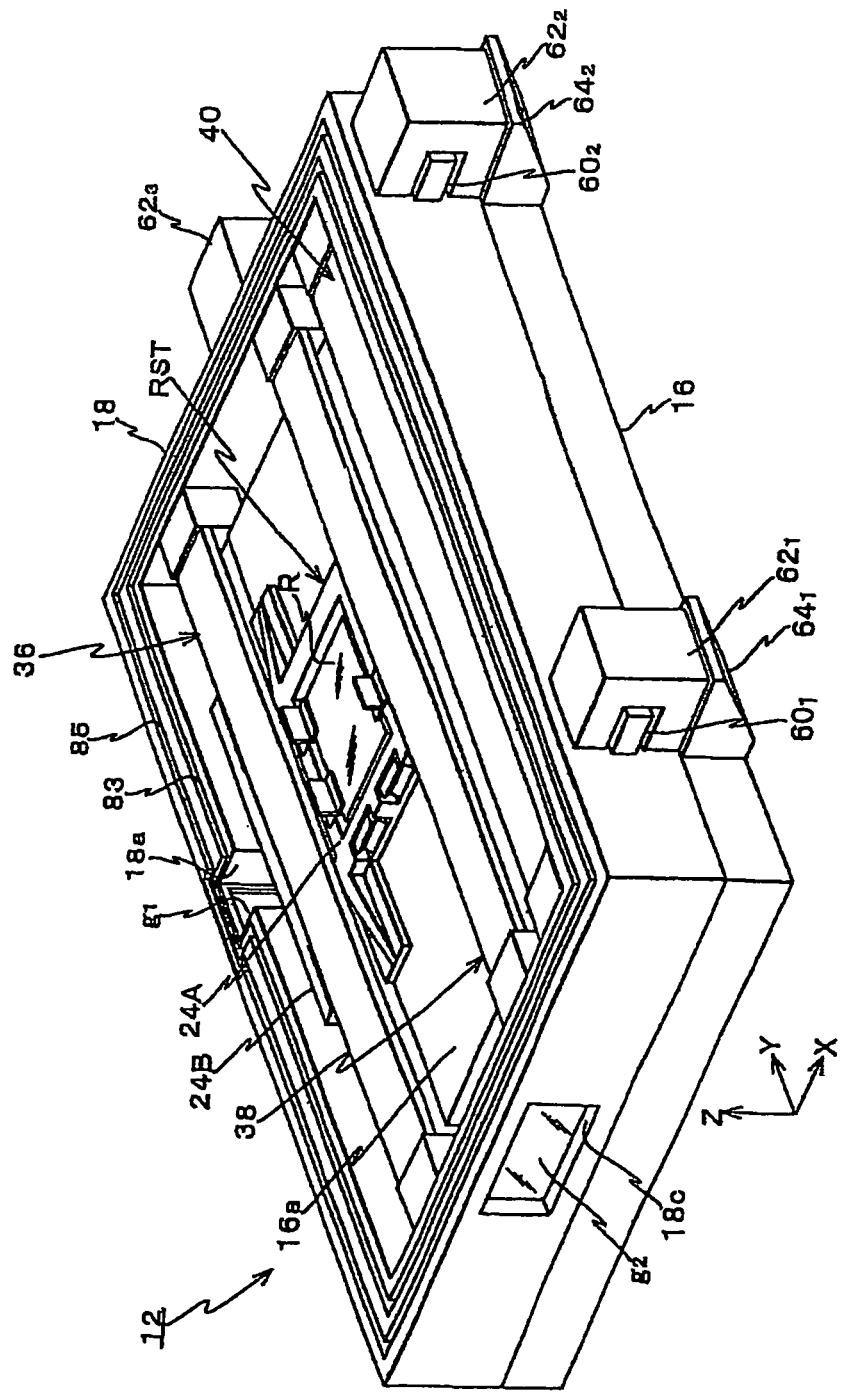
FIG. 2 is a perspective view showing a reticle stage device of FIG. 1.

As is clear from FIG. 1 and FIG. 2, which shows a perspective view of the reticle stage device 12, the reticle stage device 12 is provided with a reticle stage supporting plate 16 as a supporting plate that is arranged substantially parallel to and at a predetermined space under the illumination system side plate 14, a reticle stage RST as a slider arranged between the reticle stage supporting plate 16 and the illumination system side plate 14, a frame-shaped member (weight portion) 18 that is arranged between the reticle stage supporting plate 16 and the illumination system side plate 14 in a state in which it surrounds the reticle stage RST, a reticle stage drive system that drives the reticle stage RST, etc.

Figure 3:
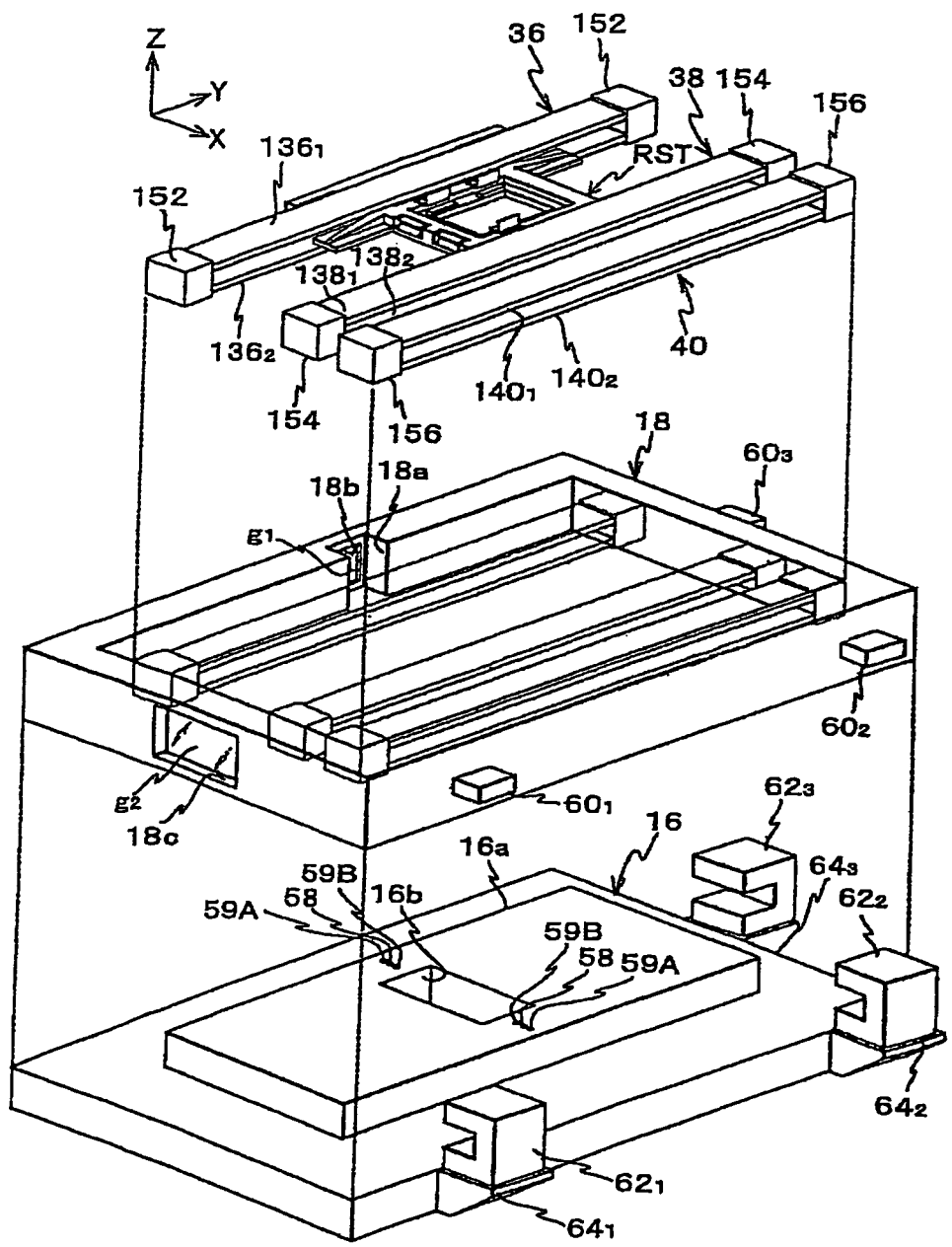
FIG. 3 is an exploded perspective view showing a reticle stage device of FIG. 2.

The reticle stage supporting plate 16 is substantially horizontally supported by an undepicted support member. As shown in FIG. 3, which is an exploded perspective view of FIG. 2, the reticle stage supporting plate 16 is formed of an approximately plate-shaped member and having a protrusion 16a formed substantially in its center. Substantially in the center of the protrusion 16a, a rectangular opening 16b, which has the X axis direction as its longitudinal direction and allows the illumination light IL to pass through, is formed to extend from the upper surface of the protrusion 16a to the lower surface of the reticle stage supporting plate 16. As shown in FIG. 1, an upper end of a lens barrel portion of the projection optical system PL is connected to the lower surface side of the reticle stage supporting plate 16 via the seal member 98, such as a V ring or an extensible bellows, in a state in which the upper end of a lens barrel portion surrounds the rectangular opening 16b.

The reticle stage RST is provided with a specially shaped reticle stage main body 22 shown in FIG. 4A, various magnetic pole units (that will be described later) fixed to the reticle stage main body 22, etc.

The reticle stage main body 22 is provided with a substantially rectangular plate-shaped portion 24A as seen from a top plan view, a mirror portion 24B arranged on the −X end portion of the plate-shaped portion 24A, and respective pairs of extensions $24C_1$, $24C_2$, $24D_1$, $24D_2$ extending in the Y axis direction from the end portions of one side and the other side, respectively, of the Y axis direction of the plate-shaped portion 24A.

Substantially in the middle portion of the plate-shaped portion 24A, an opening 22a with a step is formed and defines a passage of the illumination light IL in the middle (inside bottom surface). On the stepped portion (the portion that is stepped one level down) of the opening 22a, a plurality of (e.g., three) reticle support members 34 that support the reticle R at a plurality of points (e.g., three points) from the lower side are arranged.

In this embodiment, the reticle R is supported by the plurality of support members 34 in a state in which the pattern surface (lower surface) substantially matches a neutral plane CT of the reticle stage main body 22 (reticle stage RST). That is, the mounting surface (mounting portion) of the reticle R substantially matches the neutral plane CT of the reticle stage RST (see FIG. 4B).

Furthermore, a plurality (e.g., three) of reticle fixing mechanisms 35 are arranged in the vicinity of each reticle support member 34 of the plate-shaped portion 24A, corresponding to each respective reticle support member 34. Each reticle fixing mechanism 35 has an XZ cross section with an L shape, and is provided with a fixing member that is mounted on the plate-shaped portion 24A that is rotatable about an axis (rotation axis in the Y axis direction) arranged on the corner of the L shape. When the reticle R is mounted on the reticle support members 34, the respective fixing members are rotatably driven in a predetermined direction via an undepicted drive mechanism driven by the stage control system 90 of FIG. 1 and mechanically fix the reticle R by sandwiching the reticle R against the reticle support members 34. In this case, it is also acceptable to use a structure in which the fixing members are constantly urged by an undepicted urging means in a direction that presses the reticle R toward the support members 34.

Furthermore, instead of the reticle support members 34 and the reticle fixing mechanisms 35, or in addition to these, various chucks, such as a vacuum chuck, an electrostatic chuck, etc., also can be used.

Figure 4A:
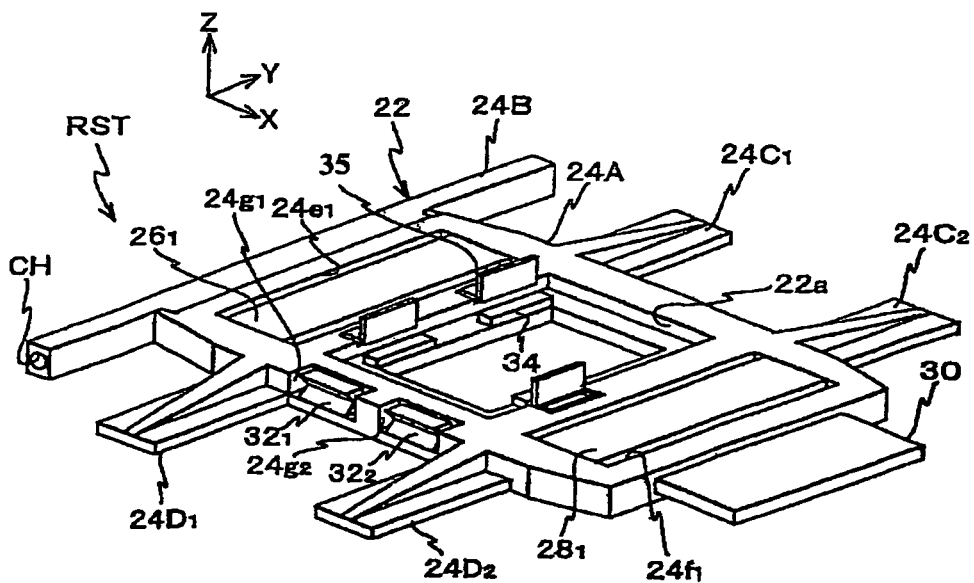
FIG. 4A is a perspective view of a reticle stage.
Figure 5A:
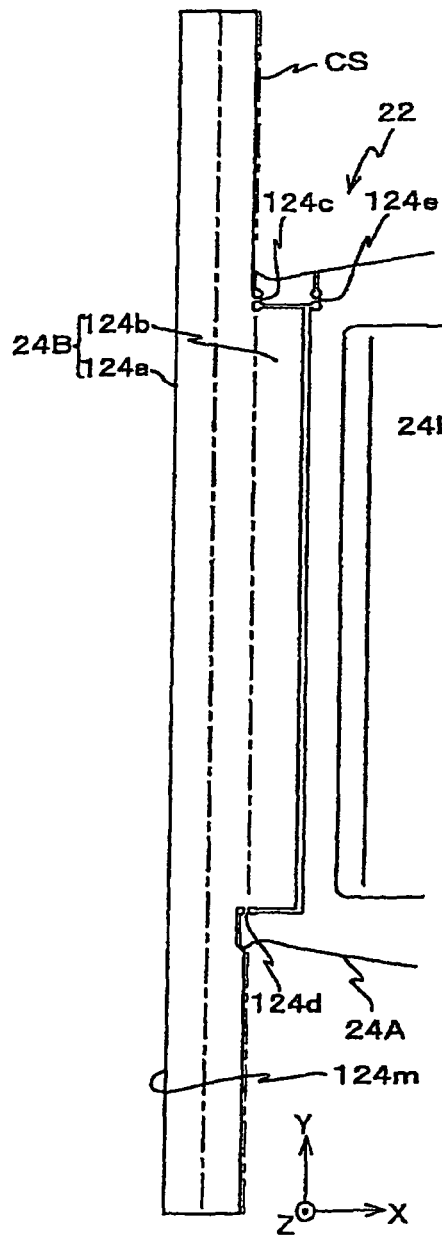
FIGS. 5A and 5B are diagrams explaining a structure and effects of a mirror portion arranged on the reticle stage.

As is clear from the combination of FIGS. 4A and 5A, the mirror portion 24B has approximately a prismatic shape that has the Y axis direction as a longitudinal direction. Mirror portion 24B includes a bar-shaped portion 124a, in which a round-shaped hollow portion CH (see FIG. 4A) is formed to improve lightness, and in the middle, excluding both end portions in the longitudinal direction of the bar-shaped portion 124a, a solid reinforcement portion 124b integrally formed on the +X side of the bar-shaped portion 124a. The end surface of the −X side of the bar-shaped portion 124a is made to be a reflective surface (reflective member) 124m on which mirror surface processing has been performed.

The mirror portion 24B and the plate-shaped portion 24A are locally connected by hinge portions 124c, 124d shown in FIG. 5A. In actuality, the reticle stage main body portion 22 including the plate-shaped portion 24A, the mirror portion 24B, and the hinge portions 124c, 124d, is integrally molded (e.g., molded by cutting them from one member); however, the following explanation uses an expression in which each part is a different member in order to make the description more easily understood. Of course, one of the above-mentioned parts can be constituted by a separate member, or all the parts can be constituted by separate members.

In detail, as shown in FIG. 5A, the mirror portion 24B is connected to the −X side end portion of the plate-shaped portion 24A via the hinge portions 124c, 124d, i.e., rotation fulcrums, arranged at the two locations on the ±Y side surface of the reinforcement portion 124b. In this case, CS connecting the two hinge portions 124c, 124d is a neutral plane when the mirror portion 24B is curved within the horizontal plane.

Figure 5B:
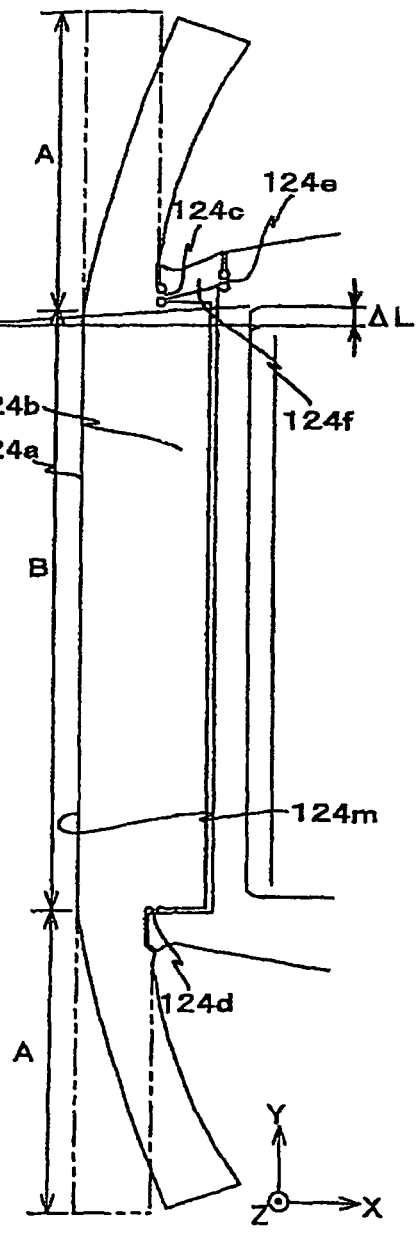

By doing this, if bending stress is generated on the mirror portion 24B for some reason, as shown in FIG. 5B, bending deformation (flexure) is generated only in the range (A and A') portion outside of both hinge portions 124c, 124d. With respect to the range (range B) to be actually used for measurement during exposure, bending deformation can be substantially reliably controlled.

In this embodiment, as shown in FIG. 5A, a similar type of hinge portion 124e is arranged in a position separated from hinge portion 124c, of the two hinge portions 124c, 124d, by a predetermined distance in the +X direction. Thus, as shown in FIG. 5B, even if extension (ΔL) in the Y axis direction is generated in the plate-shaped portion 24A, a portion 124f between the hinge portion 124c and the hinge portion 124e is partially deformed so as to be rotated about the hinge portion 124c, so the effects due to the deformation of the plate-shaped portion 24A with respect to the reflective surface 124m of the mirror portion 24B can be minimized. That is, the portion 124f sandwiched by the hinge portions 124c, 124e functions as a type of flexure.

On the −Y side end portion of the plate-shaped portion 24A of the reticle stage main body 22, as shown in FIG. 4A, two concave portions $24g_1$, $24g_2$ are formed. Retro reflectors $32_1$, $32_2$ are arranged on the concave portions $24g_1$, $24g_2$, respectively.

As shown in FIG. 4A, the four extensions $24C_1$, $24C_2$, $24D_1$, $24D_2$ have a substantially plate shape. Triangle-shaped reinforcement portions are arranged on the respective extensions in order to improve the strength. On the bottom surface of the reticle stage main body 22, a first gas hydrostatic pressure bearing is formed over the entire area from the extension $24C_1$ to the extension $24D_1$ in the Y axis direction. A second gas hydrostatic pressure bearing is formed over the area from the extension $24C_2$ to the extension $24D_2$ in the Y axis direction.

Figure 6A:
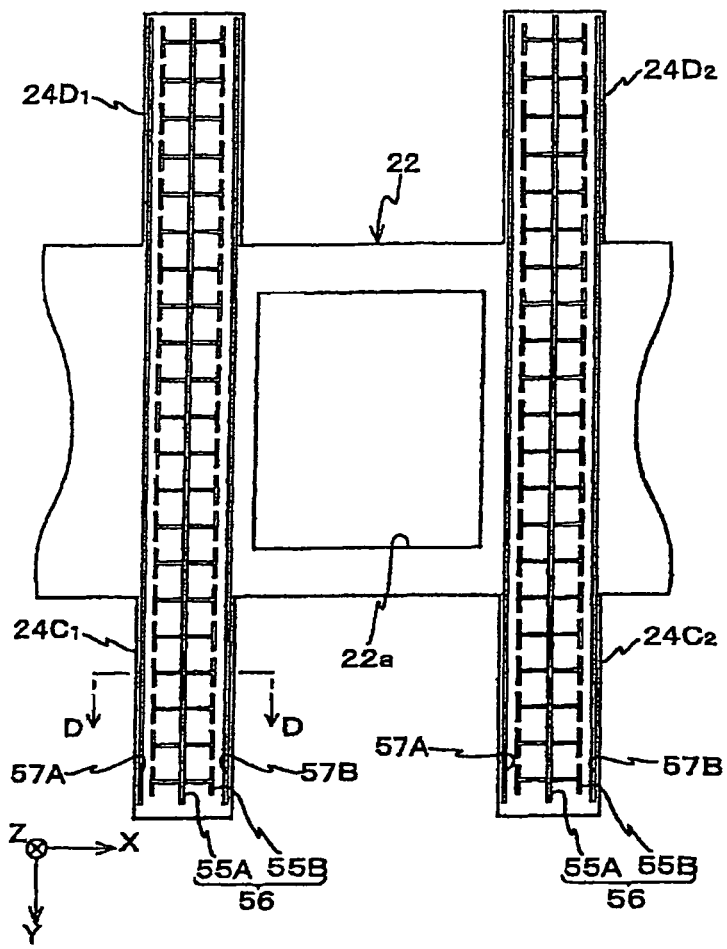
FIGS. 6A and 6B are diagrams explaining a structure of a bearing device.
Figure 6B:
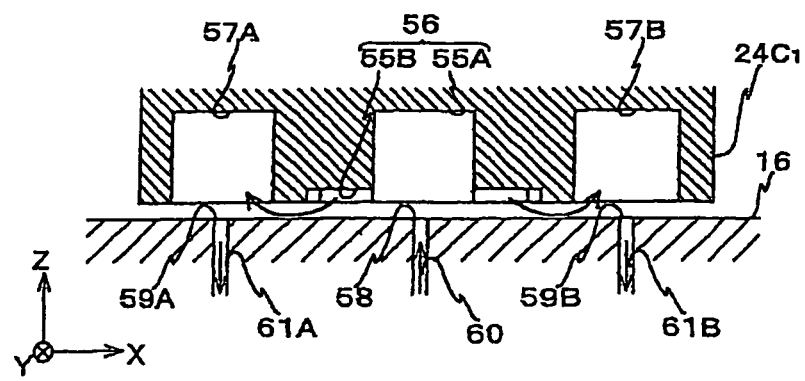

The following explains first and second gas hydrostatic pressure bearings with reference to FIGS. 6A and 6B.

FIG. 6A shows a plan view (bottom surface view) viewing the reticle stage main body 22 from the lower surface side. As is clear from FIG. 6A, three grooves are formed on the bottom surface of the reticle stage main body 22 in the areas including the extensions $24C_1$, $24D_1$, and the portion therebetween. Among these grooves, the groove positioned in the center of the X axis direction is an air supply groove 56 constituted by a stem groove 55A extended in the Y axis direction and a plurality of T-shaped surface restriction grooves 55B connected on both X axis direction sides of the stem groove 55A, and spaced from each other in the Y axis direction at a predetermined interval. As shown in FIG. 6B, which is a D-D cross-sectional view of FIG. 6A, the stem groove 55A is formed more deeply than the surface restriction grooves 55B.

Meanwhile, the two remaining grooves of the three grooves are exhaust grooves 57A, 57B extended in the Y axis direction. The exhaust grooves 57A, 57B have substantially the same cross-sectional shape as that of the stem groove 55A.

Meanwhile, as shown in FIG. 6B (and FIG. 3), on the reticle stage supporting plate 16 opposite to at least part of the respective three grooves 56, 57A, 57B, on the top surface of the protrusion portion 16a, three openings (58, 59A, 59B) are respectively formed. Among the three openings, the opening positioned in the center is an air supply port 58, and the openings positioned on both ends are exhaust ports 59A, 59B. The air supply port 58 is connected to an undepicted gas supply device via an air supply duct 60 shown in FIG. 6B. For example, a noble gas such as helium or a low absorption gas such as nitrogen is supplied from the gas supply device. In addition, the exhaust ports 59A, 59B are connected to an undepicted vacuum pump via exhaust ducts 61A, 61B.

In this embodiment, when a low absorption gas is supplied from an undepicted gas supply device via the air supply duct 60, as shown in FIG. 6B, the low absorption gas is supplied to the stem groove 55A of the air supply groove 56 from the air supply port 58 and is spread to the entire area in the Y direction of the stem groove 55A. When the low absorption gas is further supplied, the low absorption gas is blown from the plurality of surface restriction grooves 55B of the air supply groove 56 against the top surface of the reticle stage supporting plate 16.

At this time, when a suction operation is performed by a vacuum pump via the exhaust ducts 61A, 61B, the gas between the reticle stage RST and the reticle stage supporting plate 16 is output to the outside via the exhaust ports 59A, 59B. Because of this, a flow of the low absorption gas from the left and right surface restriction grooves 55B to the exhaust grooves 57A, 57B is generated in the gap between the reticle stage RST and the reticle stage supporting plate 16. As the low absorption gas continues to flow at a constant pressure and constant speed, a hydrostatic pressure (so-called pressure within a gap) of a pressurized gas within the gap is constant, and a clearance of, e.g., approximately several μm is formed and maintained between the reticle stage RST and the reticle stage supporting plate 16. That is, in this embodiment, by the portion of the reticle stage main body 22 bottom surface where the air supply groove 56, the exhaust grooves 57A, 57B, the air supply port 58, the air supply duct 60, the exhaust ports 59A, 59B, and exhaust ducts 61A, 61B are formed, a first differential exhaust type gas hydrostatic pressure bearing is formed in which a pressurized gas from an undepicted gas supply device is supplied by the reticle stage supporting plate 16 without going through piping.

Also on the bottom surface of the reticle stage main body 22 in the areas including the extensions $24C_2$, $24D_2$, and the portion therebetween, a supply groove 56 constituted by the above-mentioned stem groove 55A and the plurality of surface restriction grooves 55B, and exhaust grooves 57A, 57B on both sides are formed. In the same manner as described above, including these three grooves, a second differential exhaust type gas hydrostatic pressure bearing is formed in which a pressurized gas from an undepicted gas supply device is supplied from the reticle stage supporting plate 16 without going through piping.

Thus, in this embodiment, the reticle stage RST is floatingly supported with an approximately several micron clearance above the top surface of the reticle stage supporting plate 16, in a non-contact state by a balance between a hydrostatic pressure of a pressurized gas, blown via the top surface of the reticle stage supporting plate 16 from the surface restriction grooves 55B of the first and second differential exhaust type gas hydrostatic pressure bearings, and the weight of the entire reticle stage RST.

Returning to FIG. 2, on the top surface of the frame-shaped member 18, substantially annular concave grooves 83, 85 are formed side by side. In the inside annular concave groove 83, a plurality of air supply ports (undepicted) are formed. In the outside annular concave groove 85, a plurality of exhaust ports (undepicted) are formed. Furthermore, hereafter, the inside annular concave groove 83 is called "air supply groove 83", and the outside annular concave groove 85 is called "exhaust groove 85".

The air supply port formed inside the air supply groove 83 is connected to an undepicted gas supply device that supplies nitrogen or a low absorption gas such as a noble gas via an undepicted air supply duct and an undepicted air supply tube. Furthermore, the exhaust ports formed inside the exhaust groove 85 are connected to an undepicted vacuum pump via an undepicted exhaust duct and an undepicted exhaust tube.

Figure 9:
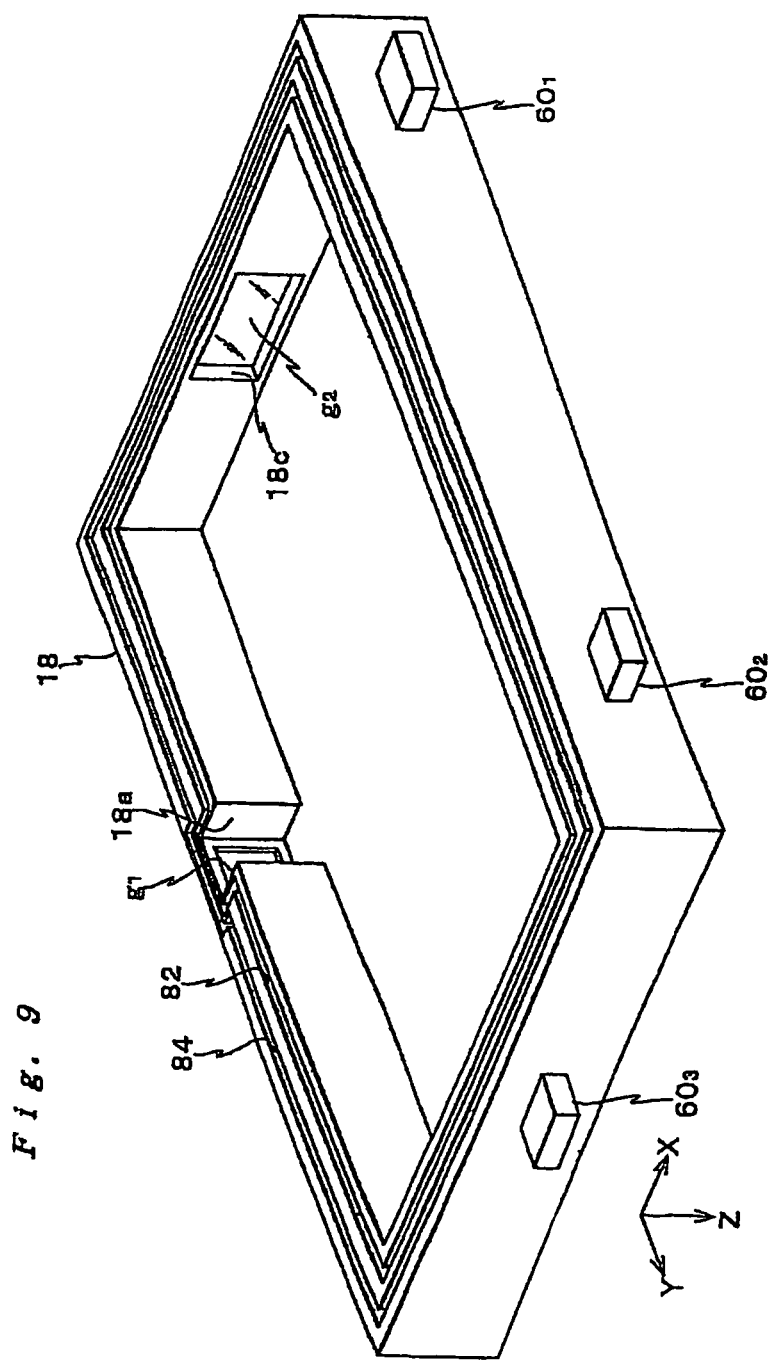
FIG. 9 is a diagram explaining a lower surface side of a frame-shaped member.

Furthermore, as is clear from FIG. 9 showing a perspective view of the frame-shaped member 18 with the top and bottom inverted, on the bottom surface of the frame-shaped member 18, substantially annular concave grooves 82, 84 are formed side by side. In the annular concave groove 82 located inside, a plurality of air supply ports (undepicted) are formed. In the annular concave groove 84 located outside, a plurality of exhaust ports (undepicted) are formed. Additionally, hereafter, the inside annular concave groove 82 is called "air supply groove 82", and the outside annular concave groove 84 is called "exhaust groove 84".

The air supply ports formed inside the air supply groove 82 are connected to an undepicted gas supply device that supplies nitrogen or a low absorption gas such as a noble gas via an air supply duct or an air supply tube. Furthermore, the exhaust ports formed inside the exhaust groove 84 are connected to an undepicted vacuum pump via an exhaust duct or an exhaust tube.

Therefore, when the gas supply device and the vacuum pump are operated, a pressurized gas (low absorption gas) is blown against the top surface of the reticle stage supporting plate 60 from the air supply groove 82 formed on the bottom surface of the frame-shaped member 18. The weight of the frame-shaped member 18 is supported by a hydrostatic pressure of the blown pressurized gas, and the frame-shaped member 18 is floatingly supported via an approximately several μm clearance above the top surface of the reticle stage supporting plate 16. In this case as well, the gas within the clearance is output to the outside by a suction force of the vacuum pump via the exhaust groove 84. In this case, a gas flow is generated from the air supply groove 82 to the exhaust groove 84. Because of this, it effectively prevents outside air from entering the frame-shaped member 18 via the clearance.

Thus, by the entire bottom surface of the frame-shaped member 18, a differential exhaust type gas hydrostatic pressure bearing is substantially constituted that floatingly supports the frame-shaped member 18 above the top surface of the reticle stage supporting plate 16.

Furthermore, when the gas supply device and the vacuum pump are operated, a pressurized gas (low absorption gas) is blown to the lower surface of the illumination system side plate 14 from the air supply groove 83 formed on the top surface of the frame-shaped member 18. At the same time, gas within a clearance between the illumination system side plate 14 and the frame-shaped member 18 is output to the outside by a suction force of the vacuum pump via the exhaust groove 85. In this case, a gas flow is generated from the air supply groove 83 to the exhaust groove 85. Because of this, it effectively prevents outside air from entering the frame-shaped member 18 via the clearance. Additionally, in this case, a clearance between the frame-shaped member 18 and the illumination system side plate 14 is maintained by a balance between a hydrostatic pressure of the blown pressurized gas and the vacuum suction force. That is, a differential exhaust type gas hydrostatic pressure bearing that maintains the clearance between the frame-shaped member 18 and the illumination system side plate 14 is substantially constituted by the entire top surface of the frame-shaped member 18.

In addition, in this embodiment, the above-mentioned clearance (i.e., bearing gap) between the frame-shaped member 18 and the reticle stage supporting plate 16 is actually determined by the overall balance between the force that the differential exhaust type gas hydrostatic pressure bearings above and below the frame-shaped member 18 apply to the frame-shaped member 18 and the entire weight of the frame-shaped member 18.

Thus, the clearance between the frame-shaped member 18 and the illumination system side plate 14 and the clearance between the reticle stage supporting plate 16 and the frame-shaped member 18 are made airtight by the gas flow. Furthermore, as described above, the upper end portion of the projection optical system unit PL and the reticle stage supporting plate 16 are connected by the above-mentioned seal member 98 (see FIGS. 7 and 8). Therefore, the space surrounded by the frame-shaped member 18 has extreme airtightness. Hereafter, the space surrounded by the frame-shaped member 18 is called an "airtight space".

As described in this embodiment, in an exposure apparatus using an exposure wavelength of a vacuum ultraviolet region, in order to avoid absorption of the exposure light by an absorption gas such as oxygen, air in an optical path between the illumination unit IOP and the projection optical system PL, i.e., within the above-mentioned airtight space needs to be replaced with nitrogen or a noble gas.

In this case, an air supply tube and an exhaust tube can be respectively connected to the side walls of the frame-shaped member 18, a low absorption gas can be supplied to the above-mentioned airtight space via the air supply tube, and an inside gas can be emitted to the outside via the exhaust tube.

In addition, nitrogen or a noble gas is supplied to the airtight space by flowing part of nitrogen or a noble gas that flows, through an undepicted air supply tube connected to the frame-shaped member 18, through the airtight space via an air supply stem tube branched out from part of the air supply duct within the frame-shaped member 18. Meanwhile, it also is acceptable to use a structure in which gas within an airtight space is emitted via an exhaust stem tube branched out from part of the exhaust duct. By doing this, along the airtightness, air in the space where the reticle R is held can be replaced with nitrogen or a noble gas in which absorption of the exposure light is lower.

Furthermore, when a helium gas is used as gas to be supplied to an airtight space, after a helium gas is collected via a gas exhaust mechanism, and impurities are removed, it is desirable that it is used again.

As shown in FIG. 2, the reticle stage drive system includes first and second drive mechanisms. The first drive mechanism is constituted by a pair of stator units (pair of stators) 36, 38 that respectively extend in the Y axis direction inside the frame-shaped member 18, and drives the reticle stage RST in the Y axis direction, and micro-drives the reticle stage RST in the θz direction (rotation direction about the Z axis). The second drive mechanism is constituted by a stator unit 40 extended in the Y axis direction on the +X side of stator unit 38 inside the frame-shaped member 18 and micro-drives the reticle stage RST in the X axis direction.

As shown in FIG. 3, which is an exploded perspective view of the reticle stage device 12, the stator unit 36 is provided with Y axis linear guides $136_1$, $136_2$ as a pair of first stators formed of an armature unit having the Y axis direction as a longitudinal direction, and a pair of fixing members (holding portions) 152 that holds the Y axis linear guides $136_1$, $136_2$ with one end portion and the other end portion in the Y axis direction (longitudinal direction). In this case, by the pair of fixing members 152, the Y axis linear guides $136_1$, $136_2$ are held parallel to the XY plane, and parallel to each other and spaced apart from each other with a predetermined spacing in the Z axis direction (up and down direction). The pair of fixing members 152 are respectively fixed to inner wall surfaces at one side and the other side (inner surface of the side walls) in the Y axis direction of the frame-shaped member 18.

Figure 7:
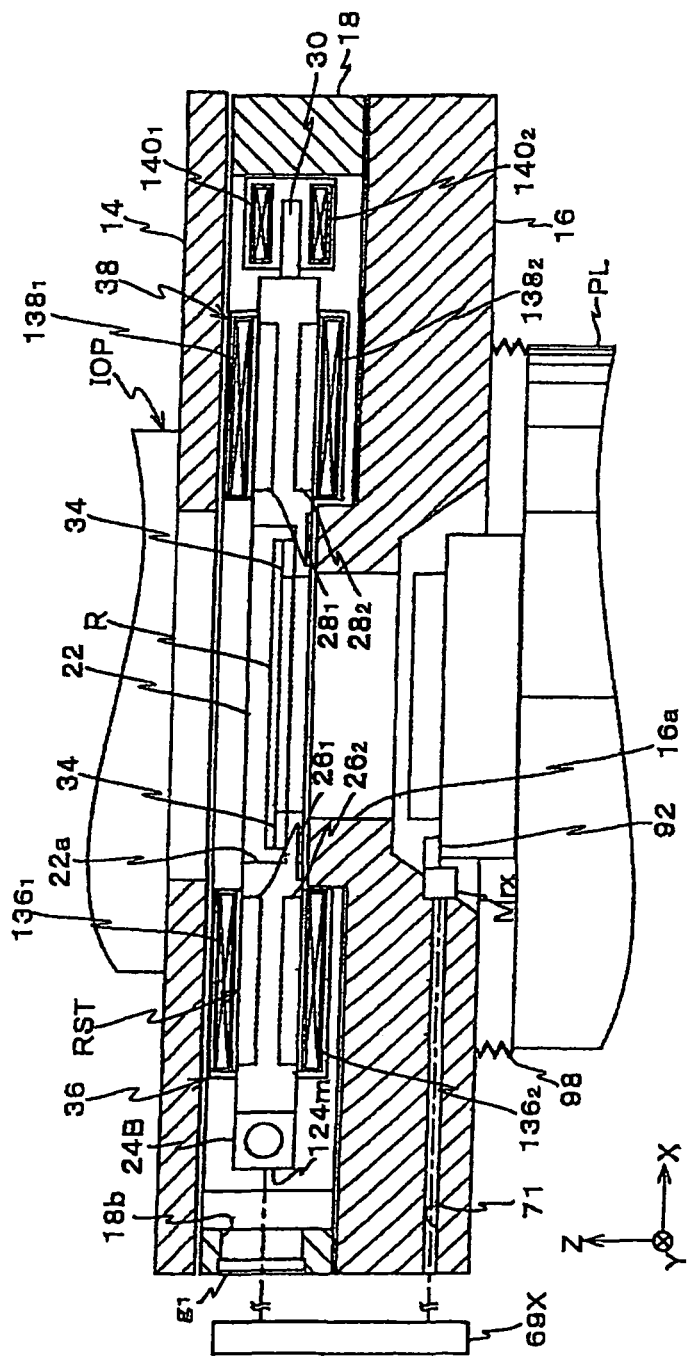
FIG. 7 is an XZ cross-sectional view of the reticle stage device.

As is clear from FIG. 3 and FIG. 7 showing the XZ cross-sectional view of the reticle stage device, the Y axis linear guides $136_1$, $136_2$ are provided with a frame formed of a non-magnetic material and having a cross section that is rectangular (rectangle). Inside the frame, a plurality of armature coils are arranged at a predetermined interval in the Y axis direction.

The stator unit 38 is constituted in the same manner as the stator unit 36. That is, the stator unit 38 is provided with Y axis linear guides $138_1$, $138_2$ as a pair of first stators formed of an armature unit having the Y axis direction as a longitudinal direction, and a pair of fixing members (holding portions) 154 fixed to both end portions in a state in which the Y axis linear guides $138_1$, $138_2$ are maintained at a predetermined interval in the Z axis direction. The pair of fixing members 154 is fixed to the inner wall surfaces of one side and the other side in the Y axis direction of the frame-shaped member 18.

The Y axis linear guides $138_1$, $138_2$ are constituted in the same manner as the Y axis linear guides $136_1$, $136_2$ (see FIG. 7).

As shown in FIG. 7, the reticle stage RST is arranged between the Y axis linear guides $138_1$, $138_2$ and the Y axis linear guides $136_1$, $136_2$, respectively, via respective predetermined clearances. Magnetic pole units $26_1$, $26_2$ are respectively embedded as a pair of first movable elements on the upper and lower surfaces of the reticle stage RST, facing the Y axis linear guides $136_1$, $136_2$, respectively. Magnetic pole units $28_1$, $28_2$ are respectively embedded as a pair of first movable elements on the upper and lower surfaces of the reticle stage RST, facing the Y axis linear guides $138_1$, $138_2$, respectively.

Figure 4B:
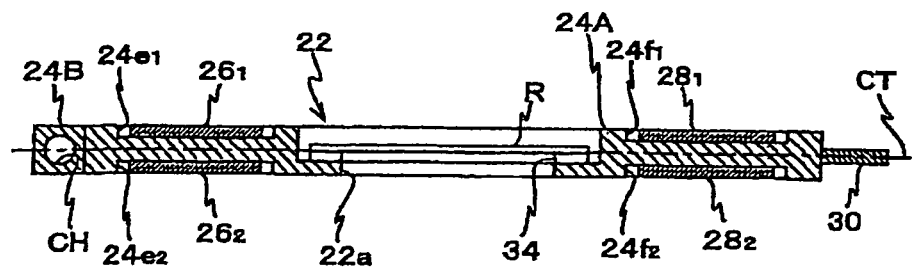
FIG. 4B is a cross-sectional view of the reticle stage.

As shown in FIG. 4B, on the −X side of the opening 22a with a step of the plate-shaped portion 24A of the reticle stage main body 22, the respective magnetic pole units $26_1$, $26_2$ are arranged within concave portions $24e_1$, $24e_2$ that are respectively formed on the upper and lower side surfaces, symmetrically with respect to the neutral plane CT of the reticle stage main body 22.

In this case, the Y axis linear guides $136_1$, $136_2$ are positioned substantially symmetrically with respect to the neutral plane CT.

The pair of magnetic pole units $26_1$, $26_2$ are respectively provided with a magnetic body member and a plurality of field magnets arranged on the surface of the magnetic body member at a predetermined interval along the Y axis direction. The plurality of field magnets are reverse-polarized with respect to each other. Therefore, an alternating field is formed along the Y axis direction in the space above the magnetic pole unit $26_1$, and an alternating field is formed along the Y axis direction in the space below the magnetic pole unit $26_2$.

In the same manner, as shown in FIG. 4B, on the +X side of the opening 22a with a step of the plate-shaped portion 24A of the reticle stage main body 22, the pair of magnetic pole units $28_1$, $28_2$ are arranged within concave portions $24f_1$, $24f_2$ that are respectively formed on the upper/lower surface sides, symmetrically with respect to the neutral surface CT of the reticle stage main body 22. Furthermore, the pair of magnetic pole units $28_1$, $28_2$ are arranged substantially symmetrical to the pair of magnetic pole units $26_1$, $26_2$ with respect to the X axis that passes through a center position (substantially matching the X axis direction position of the center of gravity of the reticle stage RST) of the X axis direction of the opening 22a with a step.

Additionally, the Y axis linear guides $138_1$, $138_2$ are positioned substantially symmetrically with respect to the neutral plane CT.

The pair of magnetic pole units $28_1$, $28_2$ are each provided with a magnetic body member and a plurality of field magnets arranged on the surface of the magnetic body member at a predetermined interval along the Y axis direction. A plurality of field magnets are reverse-polarized with respect to each other. Therefore, an alternating field is formed along the Y axis direction in the space above the magnetic pole unit $28_1$, and an alternating field is formed along the Y axis direction in the space below the magnetic pole unit $28_2$.

In this embodiment, the first drive mechanism is constituted by the above-mentioned stator units 36, 38 (including two pairs of Y axis linear guides $136_1$, $136_2$, $138_1$, $138_2$) and two pairs of magnetic pole units $26_1$, $26_2$, $28_1$, $28_2$. According to this first drive mechanism, by supplying an electric current to armature coils within the Y axis linear guides $136_1$, $136_2$, an electromagnetic force (Lorentz force) in the Y axis direction is generated by electromagnetic interaction between a magnetic field generated by the magnetic pole units $26_1$, $26_2$, and an electric current that goes through the armature units $136_1$, $136_2$. The Lorentz forces become a drive force that drives the magnetic pole units $26_1$, $26_2$ (reticle stage RST) in the Y axis direction.

In the same manner, by supplying an electric current to armature coils within the Y axis linear guides $138_1$, $138_2$, an electromagnetic force (Lorentz force) in the Y axis direction is generated by electromagnetic interaction between a magnetic field generated by the magnetic pole units $28_1$, $28_2$ and an electric current that flows through the Y axis linear guides $138_1$, $138_2$. The Lorentz forces become a drive force that drives the magnetic pole units $28_1$, $28_2$ (reticle stage RST) in the Y axis direction.

In this embodiment, the magnetic pole units $26_1$, $26_2$ and the magnetic pole units $28_1$, $28_2$ are arranged symmetrically with respect to the neutral plane CT of the reticle stage RST. The Y axis linear guides $136_1$, $136_2$ corresponding to these magnetic pole units and the Y axis linear guides $138_1$, $138_2$ are also arranged symmetrically with respect to the neutral plane CT. Because of this, by supplying the same electric current to the respective armature coils of the Y axis linear guides $136_1$, $136_2$, $138_1$, $138_2$, the same drive force is given to the magnetic pole units $26_1$, $26_2$, $28_1$, $28_2$, respectively, so the drive force (the resultant force of the drive forces of the magnetic pole units $26_1$, $26_2$, and the resultant force of the drive forces of the magnetic pole units $28_1$, $28_2$) in the Y axis direction can be caused to act through the neutral plane CT (see FIG. 4B) of the reticle stage RST. Thus, a pitching moment can be suppressed, to a great degree, from acting on the reticle stage RST.

Furthermore, in this case, the magnetic pole units $26_1$, $26_2$ and the magnetic pole units $28_1$, $28_2$ are arranged substantially symmetrically with respect to the vicinity of the center of gravity position of the reticle stage RST in the X axis direction as well, so the drive force in the Y axis direction can be caused to act on two locations at the same distance from the center of gravity of the reticle stage RST. Thus, by generating the same force at the two locations, the resultant force of the drive forces in the Y axis direction can be caused to act on the vicinity of the center of gravity position of the reticle stage RST. Therefore, a yawing moment can be suppressed, to a great degree, from acting on the reticle stage RST.

Furthermore, contrary to the above-described explanation, yawing of the reticle stage RST can be controlled by applying different drive forces in the Y axis direction that extends rightward and leftward.

As is clear from the above-described explanation, a pair of moving magnet type Y axis linear motors that drives the reticle stage RST in the Y axis direction is constituted by the magnetic pole units $26_1$, $26_2$, and the linear guides $136_1$, $136_2$ corresponding thereto. A pair of moving magnet type Y axis linear motors that drives the reticle stage RST in the Y axis direction is constituted by the magnetic pole units $28_1$, $28_2$, and the Y axis linear guides $138_1$, $138_2$ corresponding thereto. Hereafter, by using the same symbols as the linear guides that constitute the respective Y axis linear motors, the Y axis linear motors are also described as "Y axis linear motors $136_1$, $136_2$, $138_1$, $138_2$".

The above-mentioned first drive mechanism is constituted by the respective pairs of Y axis linear motors $136_1$, $136_2$, and $138_1$, $138_2$.

As shown in FIG. 3, the stator unit 40 is provided with armature units $140_1$, $140_2$ as a pair of second stators that have the Y axis direction as a longitudinal direction, and a pair of fixing members 156 holding the armature units $140_1$, $140_2$ at one end portion and the other end portion in the Y axis direction (longitudinal direction). In this case, by the pair of fixing members 156, the armature units $140_1$, $140_2$ are held parallel to the XY plane and opposite to each other at a predetermined interval in the Z axis direction (vertical direction). The pair of fixing members 156 are fixed to one side and the other side in the Y axis direction to the inner wall surface of the frame-shaped member 18.

As is clear from FIG. 7, the armature units $140_1$, $140_2$ are provided with a frame formed of a non-magnetic material and have a cross section that is rectangular (rectangle), and the armature coils are arranged therein.

As shown in FIG. 7, between the armature units $140_1$ and $140_2$, a permanent magnet 30 as a second movable element fixed to the end portion in the X axis direction of the reticle stage RST is arranged with a predetermined clearance. The permanent magnet 30 is plate-shaped and has a rectangular cross section. Instead of the permanent magnet 30, a magnetic pole unit also can be used that is formed of a flat plate-shaped magnet body member and a pair of flat plate-shaped permanent magnets that are respectively fixed to the upper and lower surfaces.

In this case, the permanent magnet 30, and the armature units $140_1$, $140_2$ are arranged and shaped substantially symmetrically with respect to the neutral plane CT (see FIGS. 4B and 7).

Therefore, an electromagnetic force (Lorentz force) in the X axis direction is generated by electromagnetic interaction between a magnetic field in the Z axis direction formed by the permanent magnet 30 and an electric current that flows in the Y axis direction through the armature coils that constitute the armature unit $140_1$, $140_2$, respectively. The Lorentz forces become a drive force that drives the permanent magnet 30 (reticle stage RST) in the X axis direction.

In this case, by supplying the same electric current to the armature coils that respectively constitute the armature units $140_1$, $140_2$, the drive force in the X axis direction can be caused to act through the position at the neutral plane CT (see FIG. 4B) of the reticle stage RST. By doing this, a rolling moment can be suppressed, to a great degree, from acting on the reticle stage RST.

As described above, by the armature units $140_1$, $140_2$ and the permanent magnet 30, a moving magnet type voice coil motor is constituted that can micro-drive the reticle stage RST in the X axis direction. Hereafter, this voice coil motor also is called a movable element that constitutes the voice coil motor, i.e., it is also called "voice coil motor 30," using the reference number of the permanent magnet. The second drive mechanism is constituted by the voice coil motor 30.

In this embodiment, furthermore, on the +X side surface and the +Y side surface of the frame-shaped member 18, as shown in FIG. 3, movable elements $60_1$, $60_2$, $60_3$ formed of magnetic pole units are arranged. Corresponding to the movable elements (first part) $60_1$, $60_2$, $60_3$, stators (second part) $62_1$, $62_2$, $62_3$ that are formed of armature units are attached to the reticle stage supporting plate 16 by members $64_1$, $64_2$ and $64_3$.

The movable elements $60_1$, $60_2$ are provided with permanent magnets inside and form a magnetic field in the Z axis direction. The stators $62_1$, $62_2$ are provided with armature coils inside, and an electric current flows in the Y axis direction due to the magnetic field in the Z axis direction. Therefore, by supplying an electric current in the Y axis direction to the armature coils within the stators $62_1$, $62_2$, the drive force (generated by Lorentz force) can be caused to act on the movable elements $60_1$, $60_2$ in the X axis direction. That is, an X axis direction driving trim motor that is formed by a moving magnet type voice coil motor is constituted by the movable element $60_1$ and the stator $62_1$. An X axis direction driving trim motor that is formed of a moving magnet type voice coil motor is constituted by the movable element $60_2$ and the stator $62_2$.

Furthermore, the movable element $60_3$ is provided with a permanent magnet inside and forms a magnetic field in the Z axis direction. The stator $62_3$ is provided with an armature coil inside, and an electric current flows in the Y axis direction due to the magnetic field in the Z axis direction. Thus, by supplying an electric current in the Y axis direction to the armature coil within the stator $62_3$, the drive force (generated by Lorentz force) in the Y axis direction can be caused to act on the movable element $60_3$. That is, a Y axis direction driving trim motor that is formed by a moving magnet type voice coil motor is constituted by the movable element $60_3$ and the stator $62_3$.

Accordingly, by using these three trim motors, the frame-shaped member 18 can be driven in the three degrees-of-freedom directions, i.e., the X axis direction, the Y axis direction, and the θz direction.

As shown in FIG. 3, a concave portion 18a is formed substantially in the center of the side wall of the −X side of the frame-shaped member 18. In this concave portion 18a, a rectangular opening 18b is formed that is connected to the inside and the outside of the frame-shaped member 18. In the rectangular opening 18b, a window glass (transparent portion) $g_1$ is mounted. Furthermore, on the side wall of the −Y side of the frame-shaped member 18, a rectangular opening 18c is formed that is connected to the inside and the outside of the frame-shaped member 18. In the opening 18c, a window glass (transparent portion) $g_2$ is mounted. Sealing by a metal seal such as indium or copper, or sealing by a fluororesin is performed over the mounting portion of the window glasses $g_1$, $g_2$ so that gas does not leak from the mounting part. In addition, it is desirable that the fluororesin should be heated at 80° C. for two hours and undergo degassing processing.

As is clear from FIG. 7, on the outside (−X side) of the window glass $g_1$, an X axis laser interferometer 69X, which is a position detector, is arranged opposite to the reflective surface 124m of the mirror portion 24B of the reticle stage RST. The length measurement beam from the X axis laser interferometer 69X is projected onto the reflective surface 124m of the mirror portion 24B via the window glass $g_1$, and the reflected light returns to the X axis laser interferometer 69X via the window glass $g_1$. In this case, the position of the optical path of the length measurement beam in the Z axis direction matches the position of the neutral plane CT.

Furthermore, as shown in FIG. 7, a fixing mirror Mrx is arranged in the vicinity of the upper end portion of the lens barrel of the projection optical system PL via a mounting member 92. A reference beam from the X axis laser interferometer 69X is projected onto the fixing mirror Mrx via a through hole (optical path) 71 formed on the reticle stage supporting plate 16, and the reflected light returns to the X axis laser interferometer 69X. In the X axis laser interferometer 69X, the reflected light of the length measurement beam and the reflected light of the reference beam are composed into coaxial light of the same polarization direction by the optical system, and the interference light of the reflected light beams is received by the detector inside. Furthermore, based on the count value of the interference fringes generated on the light receiving surface of the detector by the interference light, the X axis laser interferometer 69X constantly detects the position of the reticle stage main body 22 in the X axis direction at a resolution of, e.g., approximately 0.5-1 nm, using the fixing mirror Mrx as a reference.

Figure 8:
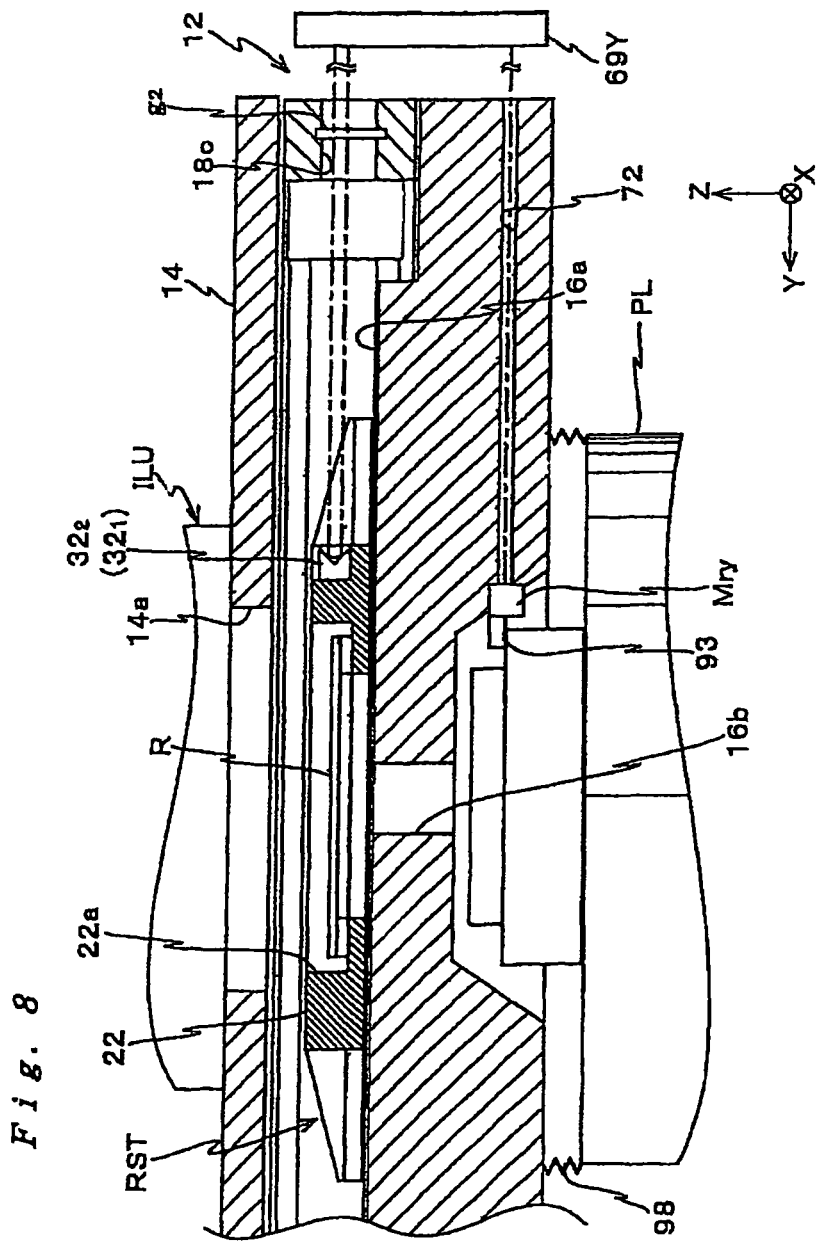
FIG. 8 is a YZ cross-sectional view of the reticle stage device.

As is clear from FIG. 8 showing a YZ cross-sectional view of the reticle stage device 12, on the outside (−Y side) of the window glass $g_2$, a Y axis laser interferometer 69Y, which is a position detector, is arranged opposite to the reflective surface of the retro reflectors $32_1$, $32_2$ arranged in the reticle stage main body 22. In this case, a pair of Y axis laser interferometers 69Y are arranged corresponding to the respective retro reflectors $32_1$, $32_2$. The length measurement beams from the respective Y axis laser interferometers 69Y are projected onto the reflective surfaces of the respective retro reflectors $32_1$, $32_2$ via the window glass $g_2$. The respective reflected light beams return to the respective Y axis laser interferometers 69Y via the window glass $g_2$. In this case, the position of the irradiation point of the length measurement beam in the Z axis direction substantially matches the position of the neutral plane CT. Additionally, as shown in FIG. 8, in the vicinity of the upper end portion of the lens barrel of the projection optical system PL, a fixing mirror Mry is arranged via a mounting member 93. The reference beam for the respective Y axis laser interferometers 69Y are respectively projected onto the fixing mirror Mry via a through hole (optical path) 72 formed on the reticle stage supporting plate 16. The respective reflected light beams return to the respective Y axis laser interferometers 69Y. Additionally, in the same manner as in the above-mentioned X axis laser interferometer 69X, the respective Y axis laser interferometers 69Y constantly detect the position of the reticle stage main body 22 in the Y axis direction at the projection position (position of the reflective surfaces of the retro reflectors $32_1$, $32_2$) of the respective length measurement beams at a resolution of e.g., approximately 0.5-1 nm, with the fixing mirror Mry as a reference, based on the interference light of the reflected light of the length measurement beam and the reflected light of the reference beam.

In this case, the rotation amount about the Z axis of the reticle stage RST also can be detected by the pair of Y axis laser interferometers 69Y.

In this embodiment, as shown in FIG. 2, the mirror portion 24B is arranged outside of the stator unit 36 (Y axis linear motors $136_1$, $136_2$). Because of this, the length measurement beam of the X axis laser interferometer 69X is not transmitted above the stator of the Y axis linear motors $136_1$, $136_2$, so heat generated by an electric current that flows through the stator of the Y axis linear motors $136_1$, $136_2$ does not affect a measurement value of the X axis laser interferometer 69X due to air fluctuation, even if air fluctuation is generated in the vicinity of the Y axis linear motors $136_1$, $136_2$. Therefore, the X axis direction position of the reticle stage RST, and in turn, the reticle R can be detected with high accuracy. In addition, in this case, as described above, the position of the optical path of the length measurement beam of the X axis laser interferometer 69X in the Z axis direction matches the position of the neutral plane CT, and the mounting surface of the reticle R also matches the neutral plane CT. Thus, the X axis direction position of the reticle stage RST, and in turn, the reticle R can be accurately measured without so-called Abbe's errors. In the pair of Y axis interferometers 69Y as well, for the same reasons, the Y axis direction position of the reticle stage RST, that is, the reticle R, can be accurately measured without so-called Abbe's errors.

Furthermore, the above-mentioned X axis laser interferometer 69X and the pair of Y axis interferometers 69Y are arranged outside of the frame-shaped member 18, so the highly likely problems caused by having each interferometer arranged inside the frame-shaped member 18 can be suppressed. For example, even if a small amount of absorption gas is generated from a detector such as a prism and an optical member that constitutes each interferometer, this does not leak a low absorption gas into the above-mentioned airtight space, and there will be no negative effect on exposure.

As described above, in actuality, as moving mirrors, the mirror portion 24B, and the reticle reflectors $32_1$, $32_2$ are provided. Accordingly, the X axis laser interferometer 69X and the pair of Y axis laser interferometer 69Y are provided, as are the window glasses $g_1$ and $g_2$. However, in FIG. 1, the reticle moving mirror Mm, the window glass g, and the reticle interferometer system 69 are depicted. Furthermore, in FIG. 1, the fixing mirrors (fixing mirror $M_{rx}$, fixing mirror $M_{ry}$) are omitted.

In the above-mentioned explanation, the position (including the θz rotation) within the XY plane of the reticle stage RST is measured by the reticle interferometer system 69. The positional information (or speed information) of the reticle stage RST from this reticle interferometer system 69 is sent to the stage control system 90 of FIG. 1, and to the main controller 70 via the stage control system 90. In the stage control system 90, according to the instructions from the main controller 70, based on the positional information (or speed information) of the reticle stage RST, the drive of the reticle stage RST is controlled.

Returning to FIG. 1, as the projection optical system PL, a reduction system that is both-side-telecentric and a dioptric system formed of a plurality of lens elements having a common Z axis direction optical axis are used. In actuality, this projection optical system PL is held by an undepicted holding member via a flange portion FLG arranged on the lens barrel portion of the projection optical system PL. The projection magnification ß of the projection optical system PL is, for example, ¼ or ⅕. Because of this, as described before, when the reticle R is illuminated by the illumination light IL from the illumination unit IOP, the circuit pattern within the illumination area IAR formed on the reticle R is reduced and projected by the projection optical system PL onto the irradiation area IA (exposure area) on the wafer conjugate to the illumination area IAR on the reticle, and a reduced image (partial inverted image) of the circuit pattern is transferred and formed.

The lens barrel of the projection optical system PL is connected to one end of an air supply duct 50 and one end of an exhaust duct 51. The other end of the air supply duct 50 is connected to an undepicted supply device of a low absorption gas, e.g., a helium gas supply device. Furthermore, the other end of the exhaust duct 51 is connected to an external gas recovery device. Furthermore, a highly purified helium gas from the helium gas supply device flows through the inside of the lens barrel of the projection optical system unit PL via the air supply duct 50. In this case, a helium gas is collected in the gas recovery device. In addition, the reason why helium gas is used as the low absorption gas, in addition to the same reason mentioned above, is that fluorite, which has a large thermal expansion coefficient, is used as a lens material of the projection optical system PL, and upon considering that the temperature increase generated by the lens absorbing the illumination light IL deteriorates an imaging characteristic of the lens, using helium gas, which is a low absorption gas with a significant cooling effect, is desirable.

The wafer stage WST is arranged within a wafer chamber 80. This wafer chamber 80 is formed by a partition wall 71 in which a round opening 71a is formed substantially in the center portion of a ceiling portion. This partition wall 71 is formed of a material with little degassing such as stainless (SUS). The lower end portion of the lens barrel of the projection optical system unit PL is inserted to the opening 71a of the ceiling portion of the partition wall 71. Furthermore, the surrounding of the opening 71a of the ceiling wall of the partition wall 71 and the flange portion FLG of the projection optical system unit PL are connected by a flexible bellows 97 without any space therebetween. Thus, the gas within the wafer chamber 80 is isolated from the outside.

In the wafer chamber 80, a stage base BS is substantially horizontally supported via a plurality of vibration isolation units 86. The plurality of vibration isolation units 86 insulate the stage base BS from micro vibration (background vibration) that is transmitted to the stage base BS from the floor F, e.g., at a micro G level. Furthermore, as a plurality of vibration isolation units 86, so-called active vibration isolation devices also can be used in which the stage base BS is positively damped based on the output of vibration sensors, such as semiconductor accelerometers, that are fixed to part of the stage base BS.

The wafer stage WST holds the wafer W by vacuum adsorption, etc. via a wafer holder 25 and is freely driven in the XY two-dimensional direction along the top surface of the base BS by an undepicted wafer drive system, including, e.g., a linear motor, etc.

As described in this embodiment, in the exposure apparatus using an exposure wavelength of a vacuum ultraviolet region, in order to avoid absorption of exposure light (illumination light IL) by an absorption gas such as oxygen, the space of the optical path from the projection optical system unit PL to the wafer W needs to be replaced with nitrogen or a noble gas.

As shown in FIG. 1, one end of an air supply duct 41 and one end of an exhaust duct 43 are respectively connected to the partition wall 71 of the wafer chamber 80. The other end of the air supply duct 41 is connected to an undepicted supply device of a low absorption gas, e.g., a helium gas supply device. Furthermore, the other end of the exhaust duct 43 is connected to an external gas recovery device. In addition, in the same manner as described before, a helium gas constantly flows through the wafer chamber 80.

A light transparent window 85 is arranged on the side wall of the −Y side of the partition wall 71 of the wafer chamber 80. In the same manner, although this is not depicted, a light transparent window also is arranged on the side wall of the +X side (front side of the paper plane of FIG. 1) of the partition wall 71. These light transparent windows are constituted by mounting a light transparent member, general optical glass in this embodiment, that seals the window portion to the window portion (opening portion) formed in the partition wall 71. In this case, sealing by a metal seal such as indium or copper, or sealing by a fluororesin is performed over the mounting portion of the window glasses so that gas does not leak from the mounting part. In addition, it is desirable that the fluororesin should be heated at 80° C. for two hours and undergo degassing processing.

On the end portion of the −Y side of the wafer holder 25, a Y moving mirror 56Y formed of a flat mirror extends in the X axis direction. The length measurement beam from a Y axis laser interferometer 57Y arranged outside of the wafer chamber 80 is projected substantially perpendicular to the Y moving mirror 56Y via the light transparent window 85. The reflected light (reflected from mirror 56Y) is received by a detector inside the Y axis laser interferometer 57Y via the light transparent window 85, and also using the position of a reference mirror inside the Y axis laser interferometer 57Y, the position of the Y moving mirror 56Y, i.e., the Y position of the wafer W, is detected.

In the same manner, although this is not depicted, on the end portion of the +X side of the wafer holder 25, an X moving mirror formed of a flat mirror extends in the Y axis direction. Furthermore, the position of the X moving mirror by the X axis laser interferometer via the X moving mirror, i.e., the X position of the wafer W, is detected in the same manner as described above. The detection values (measurement values) obtained by the above-mentioned two laser interferometers are supplied to the stage control system 90, and to the main controller 70 via the stage control system 90. In the stage control system 90, based on the instructions of the main controller 70, position control of the wafer stage WST is performed via the wafer drive system while monitoring the detection values of the two laser interferometers.

Thus, in this embodiment, a laser interferometer, i.e., a laser light source, an optical member such as a prism, a detector, etc., is arranged outside the wafer chamber 80, so even if a small amount of absorption gas is generated from the detector or the like, this does not negatively affect exposure.

Furthermore, a structure also can be used in which a helium gas is circulated and used, in which the other end of the air supply duct 50 connected to the lens barrel of the projection optical system PL and the other end of the exhaust duct 51 are respectively connected to an undepicted helium gas supply device, a highly purified helium gas is constantly supplied to the lens barrel of the projection optical system PL via the air supply duct 50 from the helium gas supply device, and gas within the lens barrel returns to the helium gas supply device via the exhaust duct 51. In this case, it is desirable that a gas purifier is provided in the helium gas supply device. Thus, because of the operation of the gas purifier, even if a helium gas is circulated and used for many hours by a circulation route including the helium gas supply device and the projection optical system PL, the concentrations of absorption gas (oxygen, moisture, organic matter, etc.) other than the helium gas within the projection optical system PL can be maintained at several ppm or less. In addition, in this case, a sensor, such as a pressure sensor, an absorption gas concentration sensor, etc., is arranged within the projection optical system PL. Based on the measurement values of the sensor, the activation and stopping of a pump housed in the helium gas supply device can be appropriately controlled via an undepicted controller.

In the same manner, a circulation route of the same type of helium gas also can be used for the wafer chamber 80.

The following briefly describes an exposure operation performed by the exposure apparatus 10.

First, a reticle and a wafer are loaded by undepicted reticle and wafer loaders, respectively, under control of the main controller 70. Furthermore, by using a reticle alignment system, a reference mark plate on the wafer stage WST, an off-axis/alignment detecting system (these are not depicted), etc., preparation operations such as base line measurement (measurement of the distance between the detecting center of the alignment detecting system and the optical axis of the projection optical system PL) etc. are performed in a predetermined order.

Then, alignment measurement such as EGA (Enhanced Global Alignment) etc. is performed by the main controller 70, using an undepicted alignment detecting system. During this operation, when the wafer W needs to be moved, based on the instructions from the main controller 70, the stage control system 90 moves the wafer stage WST holding the wafer W in a predetermined direction via an undepicted wafer drive system.

The above-mentioned reticle alignment, base line measurement, etc. are disclosed in detail in, e.g., Japanese Laid-Open Patent Application 7-176468 and U.S. Pat. No. 5,646,413 corresponding thereto. Furthermore, EGA is disclosed in detail in Japanese Laid-Open Patent Application 61-44429, and in U.S. Pat. No. 4,780,617 corresponding thereto. The disclosures of the above-mentioned U.S. Pat. Nos. 5,646,413 and 4,780,617 are incorporated herein by reference in their entireties.

After the above-mentioned EGA (alignment measurement) is completed, a step-and-scan type exposure operation is performed as follows.

Prior to this exposure operation, first the wafer stage WST is moved so that the XY position of the wafer W becomes a scanning start position (accelerating start position) for exposure of a first shot area on the wafer W. Simultaneously, the reticle stage RST is moved so that the position of the reticle R becomes a scanning start position. In addition, according to the instructions from the main controller 70, based on the positional information of the reticle R measured by the reticle interferometer system 69 and the positional information of the wafer W measured by the Y axis laser interferometer 57Y and the X axis laser interferometer on the wafer side, the stage control system 90 synchronously moves the reticle R (reticle stage RST) and the wafer W (wafer stage WST), so scanning exposure is performed.

When the transfer of the reticle pattern for the first shot area is completed, after the wafer stage WST has been stepped by one shot area in a non-scanning direction (X axis direction), scanning exposure for the following shot area is performed. Thus, a stepping operation between shots and scanning exposure are sequentially repeated, and a pattern of the reticle R is transferred onto a plurality of shot areas on the wafer W.

When the above-mentioned scanning exposure is performed, based on the instructions of the main controller 70, follow-up control of the reticle stage RST with respect to the wafer stage WST is performed by the stage control system 90, but the reaction force that accompanies the movement of the reticle stage RST is canceled by the movement of the frame-shaped member 18. The following explains this process.

That is, when the follow-up control is performed, if the reticle stage RST is driven in the X axis direction, the movable element of the voice coil motor 30 is driven in the X axis direction, integrally with the reticle stage RST, and the reaction force from this drive force acts on the stators (armature units 140$_1$, 140$_2$) of the voice coil motor 30, and on the frame-shaped member 18 to which the stators are fixed. In this case, the frame-shaped member 18 is in a non-contact state via a predetermined clearance with respect to the reticle stage supporting plate 16 and the illumination system side plate 14, so because of the effect of the reaction force, the frame-shaped member 18 moves in a direction corresponding to the reaction force for a distance according to the law of conservation of momentum. Because of this movement of the frame-shaped member 18, the reaction force is absorbed. At this time, depending on the position of the reticle stage RST in the Y axis direction, a yawing moment due to the reaction force of the drive force in the X axis direction can be caused to act on the frame-shaped member 18. In this case, the frame-shaped member 18 freely moves in $\theta z$ rotation so as to absorb a reaction force according to the law of conservation of momentum by the yawing moment and the effect of the reaction force in the X axis direction.

Meanwhile, in order for the reticle stage RST to synchronize with the wafer stage WST, when driven in the Y axis direction, the respective movable elements of the Y axis linear motors 136$_1$, 136$_2$, 138$_1$, 138$_2$ are driven in the Y axis direction and are integral with the reticle stage RST, and the resultant reaction force from the drive forces of the respective movable elements acts on the respective stators of the Y axis linear motors 136$_1$, 136$_2$, 138$_1$, 138$_2$, and on the frame-shaped member 18, to which these are fixed. In this case as well, according to the law of conservation of momentum, by the effect of the resultant reaction force, the frame-shaped member 18 moves in a direction corresponding to the resultant reaction force, for a distance by which the resultant reaction force is absorbed.

Furthermore, when the reticle stage RST is $\theta z$ rotated by causing different drive forces (thrust forces) to be generated by the Y axis linear motors 136$_1$, 136$_2$, and the Y axis linear motors 138$_1$, 138$_2$, there is a case that a yawing moment can be caused to act on the frame-shaped member 18. However, even in such a case, according to the law of conservation of momentum, the frame-shaped member 18 freely moves in $\theta z$ rotation so as to absorb the reaction force due to the yawing moment and the effect of the reaction force in the Y axis direction.

Additionally, in either case, the center of gravity of the system including the frame-shaped member 18 and the reticle stage RST does not move, so an offset load cannot be caused to act on the reticle stage supporting plate 16.

Therefore, in this embodiment, when the reticle stage RST is driven, the reaction force (the reaction in the X axis direction and the Y axis direction) generated by the driving of the reticle stage RST and the yawing moment generated by the reaction force can be reliably canceled, and the vibration due to the driving of the reticle stage RST can be controlled. Furthermore, the generation of the above-mentioned offset load also can be suppressed, so an attitude change, etc. of the reticle stage supporting plate 16 due to this offset load also can be suppressed.

Furthermore, in this embodiment, because the above-mentioned reaction force is cancelled when the frame-shaped member 18 moves above the reticle stage supporting plate 16, the main controller 70 needs to return the frame-shaped member 18 to a predetermined reference position. This is done using the above-mentioned three trim motors, via the stage control system 90 during a time when exposure is not performed, so that a shift amount from the reference position does not exceed allowable values (i.e., for example, problems will not occur such that the voice coil motor 30 cannot be controlled because of the movement of the frame-shaped member 18, or outside air enters the airtight space within the frame-shaped member 18 via a gap between the frame-shaped member 18 and the reticle stage supporting plate 16), for example.

As explained above in detail, according to the reticle stage device 12 of this embodiment, the reticle stage RST can hold the reticle R while being caused to float above the reticle stage supporting plate 16 and move along the reticle stage supporting plate 16 in three degrees-of-freedom directions within the two-dimensional plane including the Y axis and the X axis perpendicular to the Y axis, and the frame-shaped member 18 has three degrees of freedom within the two-dimensional plane while being caused to float above the reticle stage supporting plate 16. Furthermore, on the frame-shaped member 18, the respective stators (linear guides 136$_1$, 136$_2$, 138$_1$, 138$_2$) of the Y axis linear motors 136$_1$, 136$_2$, 138$_1$, 138$_2$ and stators (armature units 140$_1$, 140$_2$) of the voice coil motor 30 are arranged. The respective movable elements (magnetic pole units 26$_1$, 26$_2$, 28$_1$, 28$_2$) of the Y axis linear motors 136$_1$, 136$_2$, 138$_1$, 138$_2$ and the movable element (permanent magnet 30) of the voice coil motor 30 are arranged on the reticle stage RST.

Therefore, when the reticle stage RST is driven by the Y axis linear motors 136$_1$, 136$_2$, 138$_1$, 138$_2$ or the voice coil motor 30 in the Y axis direction and in the X axis direction, the reaction force according to the drive force is generated in (acts on) the stators (linear guides 136$_1$, 136$_2$, 138$_1$, 138$_2$) or the stators (armature units 140$_1$, 140$_2$). Because of the effect of this reaction force, the frame-shaped member 18 moves in three degrees-of-freedom directions within the two-dimensional plane substantially according to the law of conservation of momentum. That is, the frame-shaped member 18 functions as a countermass. In this case, the reaction force is substantially completely canceled by the movement of the frame-shaped member 18. At the same time, movement of the center of gravity of the system including the reticle stage RST and the frame-shaped member 18 is not generated, so an offset load is not caused to act on the reticle stage supporting plate 16. Therefore, position controllability of the reticle stage RST on which the reticle R is mounted can be improved.

Additionally, the frame-shaped member 18 is arranged so as to surround the reticle stage RST, so the size of the frame-shaped member 18 naturally becomes large, the mass also becomes large, and a large mass ratio between the frame-shaped member 18 and the reticle stage RST can be obtained. Thus, a moving stroke of the frame-shaped member 18 can be relatively short. Furthermore, substantially no problems will occur even if the frame-shaped member 18 needs to be made larger.

In addition, on the reticle stage RST, the surface on which the reticle R is mounted is formed at part of the neutral plane CT, and the position of the optical path of the length measurement beam from the reticle interferometer system 69 in the Z axis direction matches the position of the neutral plane CT. Therefore, unlike the conventional example explained above using FIG. 12B, when the reticle stage RST is deformed, a positional measurement error generated due to the shift between the neutral plane CT and the length measurement axis and a type of Abbe's error due to the positional shift of the length measurement axis and the pattern plane of the reticle R can be made substantially zero. Therefore, the position of the reticle R can be measured with high accuracy.

Additionally, the first drive mechanism that drives the reticle stage RST is provided with the respective pairs of movable elements (magnetic pole units 26$_1$, 26$_2$, 28$_1$, 28$_2$) that are arranged symmetrically with respect to the neutral plane CT, on one side and the other side, in the X axis direction, of the area where the reticle R of the reticle stage RST is mounted, and two pairs of stators (linear guides 136$_1$, 136$_2$, 138$_1$, 138$_2$) that in cooperation with the respective movable elements individually respectively generate drive forces in the Y axis direction. That is, on both sides in the X axis direction, a laminated structure is used that is formed of a movable element, the reticle stage main body, and a movable element. Additionally, the movable elements are arranged symmetrically with respect to the neutral plane CT. In this case, the neutral plane of the reticle stage RST substantially matches the height position of the center of gravity of the reticle stage RST (position in the Z axis direction), so the resultant force of the drive forces in the Y axis direction generated by the cooperation of these pairs of movable elements and stators corresponding thereto can be caused to act on the position of the center of gravity of the reticle stage RST.

Furthermore, the respective pairs of stators (linear guides 136$_1$, 136$_2$, 138$_1$, 138$_2$) are arranged symmetrically with respect to the neutral plane CT. Therefore, when the reticle stage RST is driven in the Y axis direction along the reticle stage supporting plate 16, even if the reticle stage RST is heated by the heat generation of the linear guides 136$_1$, 136$_2$, 138$_1$, 138$_2$ by an electric current supplied to the respective armature coils of the linear guides 136$_1$, 136$_2$, 138$_1$, 138$_2$, deformation of the reticle stage main body 22 due to the bimetal effect generated on the upper and lower sides of the neutral plane CT is canceled in the heated portion, and the deformation of the reticle stage RST due to the bimetal effect ultimately is not generated.

Furthermore, unlike this embodiment, for example, if the respective pairs of movable elements are constituted by armature units, when the reticle stage RST is driven in the Y axis direction along the reticle stage supporting plate 16, a slider is heated by the heat generated by the movable elements because of an electric current supplied to the movable elements. However, in this case as well, for the same reason, the deformation of the reticle stage RST is not generated due to the bimetal effect.

Therefore, the position of the reticle stage RST in the Y axis direction is measured by the pair of the Y axis interferometers 69Y via the pair of retro reflectors 32$_1$, 32$_2$ arranged on the reticle stage RST, and based on the measurement result, the position of the reticle stage RST in the Y axis direction is controlled. Thus, the position controllability of the reticle stage RST in the Y axis direction can be performed extremely well.

In addition, in the reticle stage device 12 of this embodiment, the reflective surface to which the length measurement beam in the X axis direction from the reticle interferometer system 69 is irradiated is arranged outward from the linear motors 136$_1$, 136$_2$ that drive the reticle stage RST in the Y axis direction, so even if temperature fluctuation is generated in a gas near the linear motors due to the heat generated by the linear motors, the length measurement beam in the X axis direction is not affected. Because of this, the positional measurement of the reticle stage RST in the X axis direction by the X axis interferometer 69X can be performed with high accuracy. In this case, the length measurement beam in the Y axis direction from the reticle interferometer system 69 can be irradiated to the reflective surfaces (reflective surfaces positioned at a location where the heat generated by the linear motors is hardly affected) of the retro reflectors 32$_1$, 32$_2$ arranged on the reticle stage RST without any problems occurring. Therefore, the position of the reticle stage RST in the Y axis direction and in the X axis direction can be measured with good accuracy. That is, the positional controllability of the reticle stage RST can be improved.

Furthermore, the reflective surface 124m, to which the length measurement beam in the X axis direction from the reticle interferometer system 69 is irradiated, is formed on the end surface of the bar-shaped mirror portion 24B with a predetermined length different from that of the plate-shaped portion 24A on which the reticle R of the reticle stage RST is mounted, the reinforcement portion 124b is arranged on the portion excluding both end portions in the longitudinal direction of the bar-shaped portion 124a on which the reflective surface 124m of the mirror portion 24B is formed, and both ends of the reinforcement portion 124b are coupled to the plate-shaped portion 24A via the elastic hinge portions 124c, 124d. Because of this, the portion between the elastic hinge portions 124c and 124d of the reflective surfaces, that is, the portion mainly used for position control of the reticle stage RST can be suppressed, to a great degree, from being deformed.

Furthermore, a structure is used in which: on end portions of one side and the other side of the reticle stage RST in the Y axis direction, extensions 24C$_1$-24D$_2$ extending in the Y axis direction are respectively arranged; on the bottom surface of the reticle stage RST, a gas hydrostatic pressure bearing is formed over the entire area in the longitudinal direction reaching from one side of the extension to the other side of the extension; and a pressurized gas is supplied to the gas hydrostatic pressure bearing from the reticle stage supporting plate 16 without piping. Because of this, the reticle stage RST is not driven in a pipe dragging state, and a thrust needed to maintain a uniform motion is hardly needed during exposure in which the reticle stage performs a uniform motion. Therefore, thrust ripple of the linear motors and other effects are not experienced.

Additionally, according to the exposure apparatus 10 of this embodiment, as described above, position controllability of the reticle stage RST is extremely good. Therefore, synchronization control accuracy between the reticle stage RST and the wafer stage WST can be improved. Because of this, a pattern formed on the reticle R can be transferred onto the wafer W with high accuracy.

In addition, according to the exposure apparatus 10, a space including the optical path of the illumination light IL between the illumination unit IOP and the projection optical system PL is a space purged by a low absorption gas (a specified gas whose characteristic of absorbing the illumination light IL is smaller than that of air). At the same time, the frame-shaped member 18 is used as a partition wall that divides the purged space from the outside air, so the space around the reticle stage RST can be easily made a purged space. Absorption of the illumination light IL within the purged space can be suppressed to a great degree.

Furthermore, in the above-mentioned embodiment, the first drive mechanism that drives the reticle stage RST in the Y axis direction is constituted by a pair of the Y axis linear motors, and the second drive mechanism that drives the reticle stage RST in the X axis direction is constituted by a voice coil motor, but this invention is not limited to this.

Additionally, in the above-mentioned embodiment, a case was explained in which the hollow portion CH is formed in the mirror portion 24B. However, it is not necessary to form a hollow portion in the mirror portion 24B. Furthermore, the mirror portion 24B and the plate-shaped portion 24A were integrally molded, but the invention is not limited to this. These elements can be constituted by separate members, and each member can be connected by an elastic hinge portion.

Furthermore, in the above-mentioned embodiment, the illumination system side plate 14 is arranged above the reticle stage device 12. However, a space in the vicinity of the reticle stage RST can be maintained at some degree of airtightness without arranging the illumination system side plate 14, for example, by sealing the top side (illumination system side) of the frame-shaped member while maintaining a window portion that transmits illumination light.

Additionally, in the above-mentioned embodiment, a case was explained in which the frame-shaped member 18 surrounding the reticle stage RST also is used as a partition wall that divides the space surrounding the reticle stage from the outside air, but this invention is not limited to this. The reticle stage RST and the frame-shaped member are stored in a chamber (reticle stage chamber), and the space surrounding the reticle stage RST also can be replaced with a low absorption gas. In this case, a predetermined interval is formed between the frame-shaped member and the reticle stage supporting plate, and the frame-shaped member can be movably constituted within the two-dimensional plane (XY plane). Unlike the above-mentioned embodiment, it is not necessary to arrange a gas hydrostatic pressure bearing mechanism on the top surface of the frame-shaped member.

Furthermore, in the above-mentioned embodiment, a case was explained in which a stage device of an embodiment of this invention was applied to a reticle stage device of a scanning type VUV exposure apparatus, but this invention is not limited to this. The stage device of this invention also can be suitably applied to a mask stage device of a proximity type aligner that transfers a mask pattern onto a substrate by closely contacting the mask and the substrate without a projection optical system, a mask stage device such as a step-and-repeat transfer type scanning exposure apparatus for liquid crystal, or a plate stage device, etc. In addition, the stage device of this invention also can be applied to an EBPS type electron beam exposure apparatus, and to a so-called EUVL exposure apparatus that uses light of a soft X-ray region as exposure light with a wavelength of approximately 5-30 nm.

Additionally, the invention is not limited to an exposure apparatus, but the stage device of this invention can be suitably applied to other precision machinery, etc., as long as there is a device having a moving body on which an object (sample) is mounted and that can be driven in a predetermined first axis direction and needs to be micro-moved in a second axis direction perpendicular to the first axis direction, and in a rotation direction.

Additionally, in the above-mentioned embodiment, vacuum ultraviolet light such as produced by an ArF excimer laser (wavelength 193 nm) or an $F_2$ laser (wavelength 157 nm), far ultraviolet light, such as produced by a KrF excimer laser (wavelength 248 nm), and bright lines (g line, i line, etc.) of the ultraviolet region produced by an ultra high-pressure mercury lamp can be used as the illumination light IL. However, the invention is not limited to this. Other vacuum ultraviolet light such as $Ar_2$ laser (wavelength 126 nm) light also can be used. Furthermore, for example, vacuum ultraviolet light is not limited to the above-mentioned laser, but harmonics also can be used in which a single wavelength infrared or visible laser light oscillated from a DFB semiconductor laser or a fiber laser is amplified by a fiber amplifier, in which, e.g., erbium (Er) (or both erbium and ytterbium (Yb)) is doped, and wavelength-converted to ultraviolet light by using nonlinear optical crystal. Additionally, instead of ultraviolet light, charged particle rays such as X rays (including EUV light), or an electron beam, an ion beam, etc. also can be used as illumination light IL.

Furthermore, in the above-mentioned embodiment, a case was explained that uses a reduction system as the projection optical system PL, but the projection optical system alternatively can be either a unity magnification system or an enlargement system. In addition, as the projection optical system, when vacuum ultraviolet light, e.g., an $Ar_2$ laser, is used for the illumination light IL, a so-called catadioptric system that combines refractive optical elements and reflective optical elements (a concave surface mirror, a beam splitter, etc.), or a reflective optical system formed of only reflective optical elements is mainly used, as disclosed in, e.g., Japanese Laid-Open Patent Application 3-282527, U.S. Pat. No. 5,220,454 corresponding thereto, Japanese Laid-Open Patent Application 8-171054, U.S. Pat. No. 5,668,672 corresponding thereto, Japanese Laid-Open Patent Application 10-20195, and U.S. Pat. No. 5,835,275 corresponding thereto. The disclosures of the above-mentioned U.S. Pat. Nos. 5,220,454, 5,668,672 and 5,835,275 are incorporated herein by reference in their entireties.

In addition, in the above-mentioned embodiment, a case was explained in which this invention was applied to an exposure apparatus for manufacturing a semiconductor, but the invention is not limited to this. This invention can be broadly applied to an exposure apparatus for producing liquid crystal elements that transfers a liquid crystal element pattern onto a square-shaped glass plate, an exposure apparatus for manufacturing a thin film magnetic head, an image pick-up element, an organic EL, a micro-machine, a DNA chip, or the like.

Furthermore, in order to manufacture a reticle or a mask to be used for a light exposure apparatus, an EUV exposure apparatus, an X-ray exposure apparatus, an electron beam exposure apparatus, etc., in addition to a micro-device such as a semiconductor element, this invention also can be applied to an exposure apparatus that transfers a circuit pattern onto a glass substrate, a silicon wafer, etc. Here, in an exposure apparatus using DUV (far ultraviolet) light, VUV (vacuum ultraviolet) light, etc., a transmissive type reticle is generally used. As a reticle substrate, quartz glass, quartz glass in which fluoride is doped, fluorite, magnesium fluoride, or crystal, etc. can be used.

Furthermore, this invention also can be applied to a liquid immersion type exposure apparatus where liquid is filled between the projection optical system PL and the wafer, as disclosed in, e.g., International Publication WO99/49504, the disclosure of which is incorporated herein by reference in its entirety.

The following explains a method of manufacturing a device using the above-mentioned exposure apparatus in a lithographic process.

Figure 10:
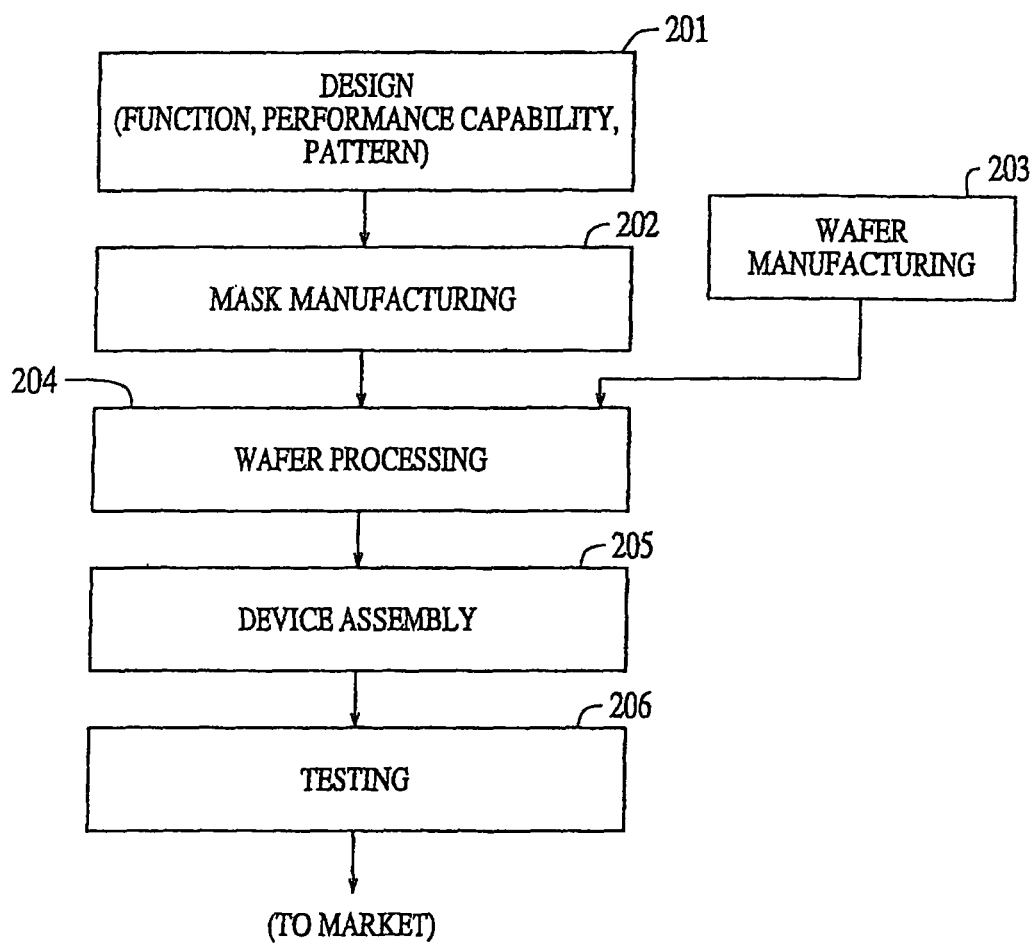
FIG. 10 is a flowchart explaining a method of manufacturing a device according to this invention.

FIG. 10 shows a flowchart of an example of a process for manufacturing a device (a semiconductor chip such as an IC and an LSI, a liquid crystal panel, a CCD, a thin film magnetic head, a micro-machine, etc.). As shown in FIG. 10, first, in step 201 (design step), device functions and performance capabilities are designed (e.g., design of a circuit of a semiconductor device, etc.), and a pattern is designed that accomplishes the functions. Subsequently, in step 202 (mask manufacturing step), a mask is manufactured on which a designed circuit pattern is formed. Meanwhile, in step 203 (wafer manufacturing step), a wafer is manufactured by using a material such as silicon.

Next, in step 204 (wafer processing step), by using the mask and wafer prepared in steps 201-203, an actual circuit, etc. is formed on the wafer by lithographic processes, etc. Next, in step 205 (device assembly step), device assembly is performed by using the wafer processed in step 204. Step 205 includes a dicing process, a bonding process, a packaging process (chip sealing), etc., as needed.

Finally, in step 206 (testing step), an operation confirmation test of the device manufactured in step 205, a durability test, etc, are performed. Upon completing these processes, the device is completed and then shipped.

FIG. 11 shows a detailed flowchart of the above-mentioned step 204 in the case of a semiconductor device. In FIG. 11, in step 211 (oxidation step), a wafer surface is oxidized. In step 212 (CVD step), an insulating film is formed on the wafer surface. In step 313 (electrode formation step), an electrode is formed on the wafer by vaporization. In step 214 (ion embedding step), ions are embedded in the wafer. The above-mentioned steps 211-214 constitute a pre-processing step for each level of the wafer processing, and are selected and performed according to the necessary processing in each level.

In each level of the wafer processing, when the above-mentioned pre-processing is completed, the following post-processing steps are performed. In this post-processing, first, in step 215 (resist formation step), a photosensitive agent is coated on the wafer. Subsequently, in step 216 (exposure step), a circuit pattern of a mask is transferred onto a wafer by the exposure apparatus 10 of the above-mentioned embodiment or another exposure apparatus of this invention. Next, in step 217 (developing step), the exposed wafer is developed. In step 218 (etching step), the exposed member, at portions other than the portion where resist remains, is removed by etching. Furthermore, in step 219 (resist removing step), the resist is removed after etching is finished.

By repeating the pre-processing steps and the post-processing steps, a circuit pattern is formed on the wafer in many layers.

If the method of manufacturing a device of this embodiment thus explained is used, the exposure apparatus of this invention such as the exposure apparatus 10 of the above-mentioned embodiment is used in the exposure step (step 216), a reticle pattern can be transferred onto a wafer with high accuracy. Productivity (including yield) of devices with high integration can be ultimately improved.

Thus, stage devices of this invention are suitable when an object is mounted and moved. Additionally, exposure apparatus of this invention are suitable when a pattern formed on a mask is transferred onto a photosensitive object. Furthermore, methods of manufacturing a device of this invention are suitable for manufacturing a micro-device.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An exposure apparatus that has an illumination optical system configured to illuminate a mask with an illumination light and a projection optical system configured to project a pattern image of the mask onto a substrate, and performs scanning exposure of the substrate by moving each of the mask and the substrate relative to the illumination light, the apparatus comprising:
a first base member arranged above the projection optical system and having a first opening through which the illumination light passes;
a first stage system that has a slider, a movable member and a first drive system, the slider being arranged on the first base member, the slider having a second opening through which the illumination light passes and a support member that is located in the second opening and supports the mask inside of the second opening, the movable member being arranged on the first base member and being provided with the slider inside, the first drive system having a first motor and moving the slider inside the movable member, and the first motor having a mover provided at the slider and a stator provided at the movable member;
a second base member arranged below the projection optical system;
a second stage system that has a stage and a second drive system, the stage being arranged on the second base member and having a holder that holds the substrate, the second drive system having a second motor that drives the stage, and the second drive system moving the stage on the second base member; and
a controller that controls the first and the second drive systems so that the mask and the substrate are each moved relative to the illumination light in a first direction orthogonal to an optical axis of the projection optical system, during the scanning exposure, wherein
the movable member is configured to be moved by a reaction force generated by a movement of the slider by the first drive system, and
the first motor includes a pair of magnetic pole units disposed above and below a support surface with which the support member supports the mask.

2. The exposure apparatus according to claim 1, wherein the movable member is a frame-shaped countermass.

3. The exposure apparatus according to claim 2, wherein the first stage system has a support device that supports the movable member by levitation on the first base member, and the movable member supported by levitation is moved by the reaction force.

4. The exposure apparatus according to claim 3, wherein the support device supports the movable member by levitation so that the movable member can be moved in a plurality of directions including the first direction.

5. The exposure apparatus according to claim 4, further comprising
a third motor having a mover provided at the movable member and a stator provided at the first base member, wherein the third motor is configured to move the movable member at least in the first direction.

6. The exposure apparatus according to claim 5, wherein a position of the movable member that is moved by the reaction force can be adjusted by the third motor.

7. The exposure apparatus according to claim 6, wherein the slider is supported in a noncontact manner on the first base member, and can be moved in a plurality of directions that include the first direction and a second direction perpendicular to the first direction within a predetermined plane orthogonal to the optical axis of the projection optical system.

8. The exposure apparatus according to claim 7, wherein the first motor has a pair of linear motors that are arranged on one side and the other side of the slider in the second direction, and
each of the pair of linear motors includes a pair of the movers arranged on an upper surface side and a lower surface side of the slider and the stator arranged facing the pair of the movers.

9. The exposure apparatus according to claim 8, wherein the first motor has another motor different from the pair of linear motors, and moves the slider in the second direction with the another motor.

10. The exposure apparatus according to claim 9, wherein the slider further has a fixing member that presses the mask.

11. A device manufacturing method, comprising:
exposing a substrate using the exposure apparatus according to claim 1; and
developing the substrate that has been exposed.

12. An exposure method of performing scanning exposure of a substrate with an illumination light via a projection optical system, the method comprising:
supporting a mask on a first base member, with a slider provided inside a movable member, the first base member being arranged above the projection optical system and having a first opening through which the illumination light passes, and the mask being supported by a support member inside of a second opening, through which the illumination light passes, of the slider;
moving the slider inside the movable member, with a first drive system that has a first motor having a mover provided at the slider and a stator provided at the movable member, the first motor including a pair of magnetic pole units disposed above and below a support surface with which the support member supports the mask;
moving a stage having a holder that holds the substrate on a second base member, with a second drive system having a second motor that drives the stage, the second base member being arranged below the projection optical system; and
controlling the first and the second drive systems so that the mask and the substrate are each moved relative to the illumination light in a first direction orthogonal to an optical axis of the projection optical system, during the scanning exposure, wherein
the movable member is moved by a reaction force generated by a movement of the slider by the first drive system.

13. The exposure method according to claim 12, wherein the movable member is a frame-shaped countermass, and is supported by levitation on the first base member so that the movable member can be moved in a plurality of directions including the first direction.

14. The exposure method according to claim 13, wherein a position of the movable member that is moved by the reaction force can be adjusted by a third motor having a mover provided at the movable member and a stator provided at the first base member.

15. The exposure method according to claim 14, wherein the slider is supported in a noncontact manner on the first base member, and is moved in a plurality of directions that include the first direction and a second direction perpendicular to the first direction within a predetermined plane orthogonal to the optical axis of the projection optical system.

16. A device manufacturing method, comprising:
exposing a substrate using the exposure method according to claim 12; and
developing the substrate that has been exposed.

17. The exposure apparatus according to claim 1, wherein a position of the support surface with which the support member supports the mask matches a neutral plane of the slider in a direction parallel to the optical axis of the projection optical system.

18. The exposure method according to claim 12, wherein a position of the support surface with which the support member supports the mask matches a neutral plane of the slider in a direction parallel to the optical axis of the projection optical system.

* * * * *